United States Patent [19]
Lee

[11] Patent Number: 5,966,314
[45] Date of Patent: Oct. 12, 1999

[54] FINITE IMPULSE RESPONSE FILTER

[75] Inventor: Kyu-Don Lee, Seoul, Rep. of Korea

[73] Assignee: SamSung Electronics Co., Ltd., Kyungki-do, Rep. of Korea

[21] Appl. No.: 08/675,488

[22] Filed: Jul. 1, 1996

[30] Foreign Application Priority Data

Jun. 29, 1995 [KR] Rep. of Korea ...................... 95-18295
Jun. 12, 1996 [KR] Rep. of Korea ...................... 96-21065

[51] Int. Cl.[6] ............................. G06F 17/10; G06F 17/17
[52] U.S. Cl. ................................. 364/724.16; 364/724.1; 364/724.13
[58] Field of Search ..................... 364/724.011, 724.012, 364/724.13, 724.16, 724.1, 724.2

[56] References Cited

U.S. PATENT DOCUMENTS

| | | | |
|---|---|---|---|
| 5,027,306 | 6/1991 | Dattorro et al. ...................... | 364/724.1 |
| 5,313,412 | 5/1994 | Nukui ................................. | 364/724.16 |
| 5,374,931 | 12/1994 | Wiener ................................ | 342/115 |
| 5,379,242 | 1/1995 | Rose et al. ........................ | 364/724.011 |
| 5,381,357 | 1/1995 | Wedgwood et al. ................ | 364/724.16 |
| 5,404,322 | 4/1995 | Gehring .............................. | 364/724.16 |
| 5,487,084 | 1/1996 | Misaizu et al. .......................... | 375/215 |

*Primary Examiner*—Chuong Dinh Ngo
*Attorney, Agent, or Firm*—Robert E. Bushnell, Esq.

[57] ABSTRACT

A finite impulse response filter and its filtering method are disclosed including a first delay portion for delaying input data, a second delay portion for receiving a final delay output from the first delay portion and delaying it, a first ROM bank having a plurality of ROMs for storing filter state values, a second ROM bank having a plurality of ROMs for storing filter state values, a first address generator for generating data as a first address, a second address generator for generating data as a second address, a first multiplexer for sequentially multiplexing the filter state values output from the ROMs of the first ROM bank, a second multiplexer for sequentially multiplexing the filter state values output from the ROMs of the second ROM bank, and an adder for summing the outputs of the first and second multiplexers and outputting the result as filter output data.

35 Claims, 14 Drawing Sheets

Fig. 13A CLK1
Fig. 13B CLK2
Fig. 13C CLK5
Fig. 13D DELAY1 DATA
Fig. 13E DELAY2 DATA
Fig. 13F OUT
Fig. 13G $\overline{OUT}$
Fig. 13H SIGNAL PROCESSING PORTION 1 OUTPUT
Fig. 13I LOOK-UP TABLE
Fig. 13J SIGNAL PROCESSING PORTION 3 OUTPUT
Fig. 13K REGISTER OUTPUT
Fig. 13L ADDER OUTPUT (FILTER OUTPUT)

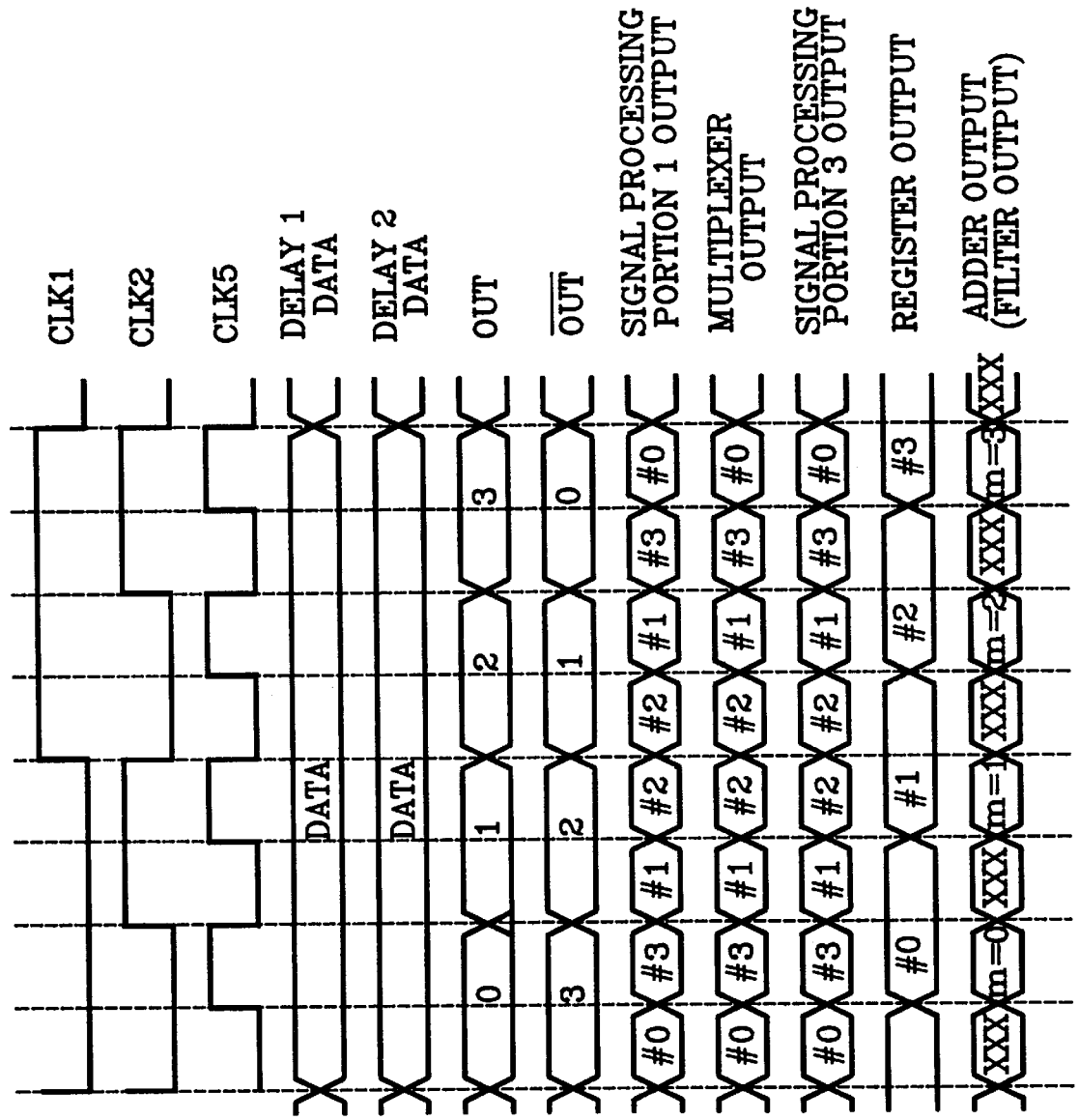

FINITE IMPULSE RESPONSE FILTER

CROSS REFERENCE TO RELATED APPLICATION

This application makes reference to, incorporates the same herein, and claims all benefits accruing under 35 U.S.C. §119 from an application entitled Finite Impulse Response Filter earlier filed in the Korean Industrial Property Office on Jun. 29, 1995, which was duly assigned Ser. No. 18295/1995 by that Office, and an application entitled Finite Impulse Response Filter earlier filed in the Korean Industrial Property Office on Jun. 12, 1996, Ser. No. 21065/1996.

BACKGROUND OF THE INVENTION

1. Field of the Invention

The present invention relates to a finite impulse response filter, and more particularly, to a finite impulse response filter and its filtering method for reducing the ROM capacity needed to store multiple filter state values.

2. Description of the Related Art

A representative filter for use in a digital signal processing system is a finite impulse response (hereinafter referred to as FIR) filter. As compared with a filter consisting of passive elements such as resistor R, inductor L and capacitor C, the FIR filter exhibits a relatively superior performance, which is currently used in most digital signal processing systems. FIR filtering is divided into two mode, or types, a tapped delay line mode and lookup table mode according to its structure and manner.

A configuration of an FIR filter in accordance with the tapped delay line mode, which performs filtering by convolution has filter input data is applied to a shift register, this filter input data forms N input data lines. Multipliers respectively multiply the N bit input data by N filter coefficient values which may be stored in a storage device. Then, an adder or plural adders sum the outputs of the multipliers and outputs the result as filter output data.

The FIR filter of tapped delay line mode is the most widely used. When FIR filtering is implemented in a parallel processing method, however, N multipliers and N-1 adders are required, thus undesirably increasing hardware size. Meanwhile, even when FIR filtering is implemented in a serial processing method, N multiplication steps and N-1 adding steps must be performed while one bit of input data is applied, requiring high-speed hardware implementation. Examples of known tapped delay line FIR filters, incorporated herein by reference, are: U.S. Pat. No. 5,404,322, by Mark Gehring and entitled Digital Filter And Method Of Design; and U.S. Pat. No. 5,381,357, by Janet Wedgwood, et al., entitled Complex Adaptive FIR Filter.

In a configuration of an FIR filter in accordance with the lookup table mode, filter output values corresponding to N input combinations are previously calculated and stored in a lookup table, such as a ROM. Here, as each bit of data is applied to an input shift register, the current filter input data forms N input data lines. An address generator generates addresses in response to the N bit input data. Corresponding to the generated addresses, the filter output value stored in the lookup table is output as filter output data. Such a filtering mode does not use multipliers and requires no high-speed hardware in implementing a filter. However, this mode is disadvantageous because the capacity of the ROM necessarily increases when the number of taps of the filter increases. Examples of FIR filters using ROMs to store calculated filter output values, incorporated herein by reference, are: U.S. Pat. No. 5,487,084, by Kouei Misaizu, et al., entitled Nyquist Filter For Digital Modulation; U.S. Pat. No. 5,379,242, by Dennis Rose, et al., entitled ROM Filter; U.S. Pat. No. 5,374,931, by Alan Wiener, entitled Radar Target Velocity Extimator; U.S. Pat. No. 5,313,412, by Yoshihiro Nukui, entitled Oversampling Type Finite Impulse Response Filter; and U.S. Pat. No. 5,027,306, by Jon Dattorro, et al., entitled Decimation Filter As For A Sigma-Delta Analog-To-Digital Converter.

SUMMARY OF THE INVENTION

Therefore, it is an object of the present invention to provide an FIR filter and its filtering method utilizing a ROM having a small storage capacity.

It is another object of the present invention to provide an FIR filter and its filtering method for performing high-speed filtering.

It is still another object of the present invention to provide an FIR filter and its filtering method for reducing hardware size.

It is yet another object of the present invention to provide an FIR filter and its filtering method using a smaller capacity ROM by controlling a symbol clock rate.

To accomplish the objects of the present invention, an FIR filtering method is provided in which input data of a predetermined impulse form is delayed using two delay lines to form two data lines, these two data lines generating one or two addresses for accessing and outputting a filter state value, corresponding to the generated address, among the filter state values stored in one or two memories.

According to a first aspect of the present invention, a filtering method is provided for a finite impulse response filter with at least first and second ROM banks for storing filter state values in accordance with a predetermined number of taps, wherein input data of a predetermined impulse form is delayed using two delay lines, data formed by the delay lines are generated as address data for accessing the filter state value stored in the first and second ROM banks, and the filter state values from the first and second ROM banks accessed by the address data are summed to be output as filter output data. In this aspect, the delay lines each are formed of L/2 delay devices, and the first and second ROM banks each have the capacity of $2^{L/2}$.

According to a second aspect of the present invention, a filtering method is provided for a finite impulse response filter with at least first and second ROM banks made up with a plurality of ROMs for storing filter state values in accordance with a predetermined number of taps, a first delay portion for delaying input data of a predetermined impulse form by L/2 steps according to a predetermined symbol rate, and a second delay portion for delaying the data last delayed and output by the first delay portion by L/2 steps. A one's complement is selectively performed on the output values in the rest of the delay steps of the first delay portion according to the output value of the initial delay step performed by the first delay portion, and the complemented, or non-complemented, values are generated as a first address. A one's complement is selectively performed on the output values in the rest of the delay steps of the second delay portion according to the output value of the final delay step performed by the second delay portion, and generating the complemented, or non-complemented, values are generated as a second address. The filter state value corresponding to the first address among the filter state values stored in the respective ROMs of the first ROM bank is accessed the filter state value corresponding to the second address among the filter state values stored in the respective ROMs of the second ROM bank is accessed the filter state value corresponding to the first addressed is multiplexed according to a clock oversampling rate/2 times as large as the symbol rate; the filter state value corresponding to the second address is multiplexed according to a clock oversampling rate/2 times as large as the symbol rate; a first state value is generated by either performing a two's complement on the output value obtained by multiplexing the filter state value corresponding to the first address or that output value is directly transmitted, in accordance with the output value of the initial delay step performed by the first delay portion; a second state value is generated by either performing a two's complement on the output value obtained by multiplexing the filter state value corresponding to the second address or that output value is directly transmitted, in accordance with the output value of the final delay step performed by the second delay portion; and filtered data is generated by adding the first and second state values.

In the second aspect, the respective ROMs of the first and second ROM banks have the capacity of $2^{(L/2)-1}$, and when the output value of the initial delay step performed by the first delay portion is "1", the output values of the rest of the delay steps of the first delay portion are ones complemented to be generated as the first address, or when the output value is "0", non-complemented values are generated as the first address. When the output value of the final delay step performed by the second delay portion is "1", the output values of the rest of the delay steps of the second delay portion are ones complemented to be generated as the second address, or when the output value is "0", non-complemented values are generated as the second address. When the output value of the initial delay step performed by the first delay portion is "1", the output value of the first ROM bank is twos complemented, or when the output value is "0", the output value of the first ROM bank is directly output. When the output value of the final delay step performed by the second delay portion is "1", the output value of the second ROM bank is twos complemented, or when the output value is "0", the output value of the second ROM bank is directly output.

According to a third aspect of the present invention, a filtering method is provided for a finite impulse response filter comprising at least a lookup table for storing filter state values in accordance with a predetermined number of taps, a first delay portion having L/2 delay devices for delaying input data of a predetermined impulse form by L/2 steps according to a predetermined symbol rate, and a second delay portion having L/2 delay devices corresponding to the respective delay devices of the first delay portion for delaying the data output by the final delay device of the first delay portion by L/2 steps, the method comprising the steps of: (1) multiplexing and outputting the output value of the initial delay step of the first delay portion and the output value of the final delay step of the second delay portion according to a clock four times as large as the symbol rate; (2) counting a clock two times as large as the symbol rate according to a predetermined oversampling rate, and outputting a first output signal indicative of the counting result and a second output signal indicative of a reverse counting result due to a reverse counting sequence of the clock two times as large as the symbol rate; (3) multiplexing and outputting the first and second output signals according to the clock four times as large as the symbol rate; (4) multiplexing and outputting the rest of the delay output values excluding the output value of the initial delay step of the first delay portion and the output value of the final delay step of the second delay portion corresponding thereto according to the clock four times as large as the symbol rate; (5) exclusive-ORing and outputting the value output in step (1) with respect to the values output in step (4); (6) generating an address which takes the value output in step (3) as the address's MSB and the values output in step (5) as the rest of the address's bits; (7) accessing and outputting a filter state value corresponding to the generated address among filter state values stored in a lookup table; (8) performing a twos complement of the filter state value output in step (7) or directly outputting the filter state value according to the output value of step (1); (9) temporarily storing the filter state value output in step (8) and then outputting the stored filter state value; and (10) summing the filter state values output obtained in steps (8) and (9), and outputting the result as filter output data.

In the third aspect, the lookup table has the capacity of $2^{(L/2)+1}$. When the output value of step (1) is "1", the output value output in step (7) is twos complemented and then output. When the output value of step (1) is "0", the output value in step (7) is directly output.

According to a fourth aspect of the present invention, there is provided a filtering method for a finite impulse response filter comprising at least a ROM bank made up with a plurality of ROMs for storing filter state values in accordance with a predetermined number of taps, a first delay portion made up with L/2 delay devices for delaying input data of a predetermined impulse form by L/2 steps according to a predetermined symbol rate, and a second delay portion made up with L/2 delay devices for delaying the data output by the final delay device of the first delay portion by L/2 steps, the method comprising the steps of: (1) counting a clock two times as large as the symbol rate according to a predetermined oversampling rate, and outputting a first output signal indicative of a result of counting in a first direction and a second output signal indicative a result of counting in a reverse direction; (2) multiplexing and outputting the first and second output signals according to a clock four times as large as the symbol rate; (3) multiplexing and outputting the output value of the initial delay step performed by the first delay portion and the output value of the final delay step performed by the second delay portion according to the clock four times as large as the symbol rate; (4) multiplexing and outputting the rest of the delay output values excluding the output value of the initial delay step of the first delay portion and the output value of the final delay step of the second delay portion corresponding thereto according to the clock four times as large as the symbol rate; (5) exclusive-ORing the value output in step (3) with respect to the values output in step (4), and generating the result as an address; (6) accessing and outputting a stored filter state value corresponding to the generated address among filter state values stored in the ROMs of the ROM bank; (7) multiplexing and outputting the filter state value output in step (6) according to the value output in step (2); (8) performing a twos complement of the filter state value output in step (7) or directly outputting the filter state value output in step (7) dependent upon the output value of step (3); (9) temporarily storing the filter state value output in step (8) and then outputting the stored filter state value; and (10) summing the filter state values output in steps (8) and (9), and outputting the result as filter output data.

In the fourth aspect of the present invention, the respective ROMs of the ROM bank have the capacity of $2^{(L/2)-1}$. When the output value of the step (3) is "1", the output value output in step (7) is twos complemented, or when the output value in step (3) is "0", the output value of step (7) is directly output.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 13A–13L are timing diagrams of the FIR filter of FIG. 11;

FIGS. 16A–16L are timing diagrams of the FIR filter of FIG. 14.

DETAILED DESCRIPTION OF THE PREFERRED EMBODIMENT

Figure 1:
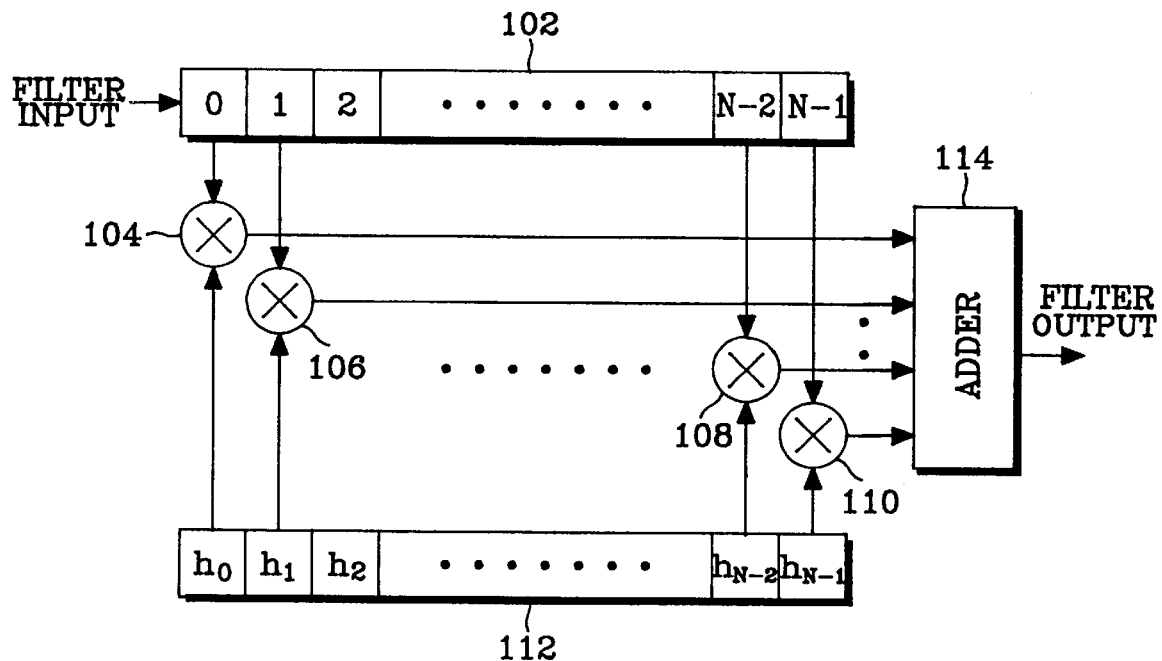
FIG. 1 illustrates an example of a FIR filter in accordance with a tapped delay line mode.

Hereinafter, preferred embodiments of the present invention will be described with reference to the attached drawings.

The terms stated below are defined in consideration of their functions in the present invention but may vary with a user or chip designer's intention or practice. Therefore, their definitions should be determined on basis of the whole specification's contents. Reference character L indicates the length of filter. Reference character m is an oversampling rate. Reference character N is the number of filter taps. Reference character n is the number of bits of data output from a ROM. The number of filter taps N is equal to filter length L multiplied by oversampling rate m. Clock CLK1 indicates a symbol clock rate. Clock CLK2 is a clock two times as large as the symbol clock rate. Clocks CLK3 and CLK4 are clocks m/2 times as large as the symbol clock rate. Clock CLK5 is a clock four times as large as the symbol clock rate. Clocks CLK3 and CLK4 indicate output values in which the clock CLK2 is counted, in accordance with oversampling rate m, in opposite counting direction. The two clocks have the same period of different levels.

FIG. 1 illustrates a configuration of an FIR filter in accordance with the tapped delay line mode, which performs filtering by convolution. Referring to FIG. 1, when one bit of data is applied to a shift register 102, this filter input data forms N input data lines together with N-1 bits of input data previously received in shift register 102. Multipliers 104, 106, . . . , 108, 110 respectively multiply the N bit input data by N filter output values h0, h1, h1, . . . , hN-2, hN-1 which are stored in storage 112. Then, an adder 114 sums the outputs of multipliers 104, 106, . . . , 108, 110, and outputs the result as filter output data.

The FIR filter of tapped delay line mode is the most widely used. When FIR filtering is implemented in a parallel processing method, however, N multipliers and N-1 adders are required, thus undesirably increasing hardware size. Meanwhile, even when FIR filtering is implemented in a serial processing method, N multiplication steps and N-1 adding steps must be performed while one bit of input data is applied, requiring high-speed hardware implementation.

Figure 2:
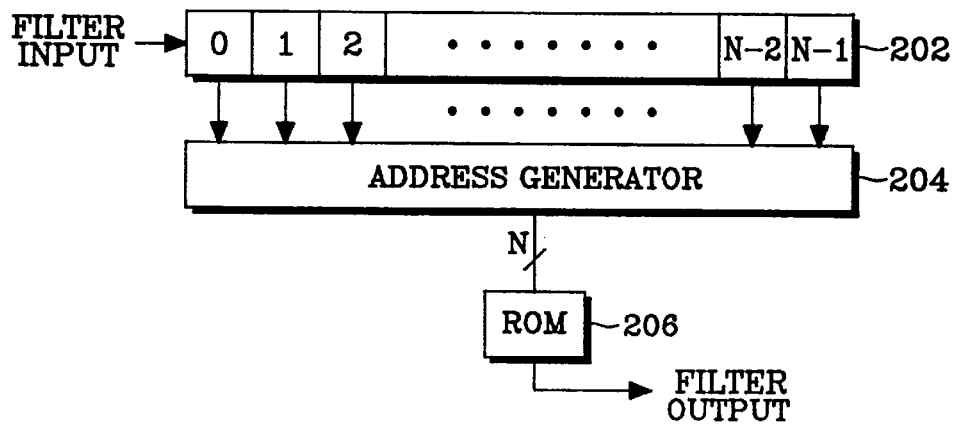
FIG. 2 illustrates an example of a FIR filter in accordance with a lookup table mode.

FIG. 2 illustrates a configuration of an FIR filter in accordance with the lookup table mode. Referring to FIG. 2, a filter output values corresponding to N input combinations are previously calculated and stored in a ROM 206. Here, as each bit of data is applied to a shift register 202, the current filter input data forms N input data lines together with N-1 bit input data which are previously input in shift register 202. An address generator 204 produces N bit input data as addresses. Corresponding to the addresses, the filter output value stored in ROM 206 is output as filter output data. Such a filtering mode does not use multipliers and requires no high-speed hardware in implementing a filter. However, this mode is disadvantageous because the capacity of the ROM necessarily increases when the number of taps of the filter increases.

Prior to the description of an FIR filter of the present invention, a modulator for a binary data transmission system to which the present invention will be adopted will be discussed.

Figure 3:
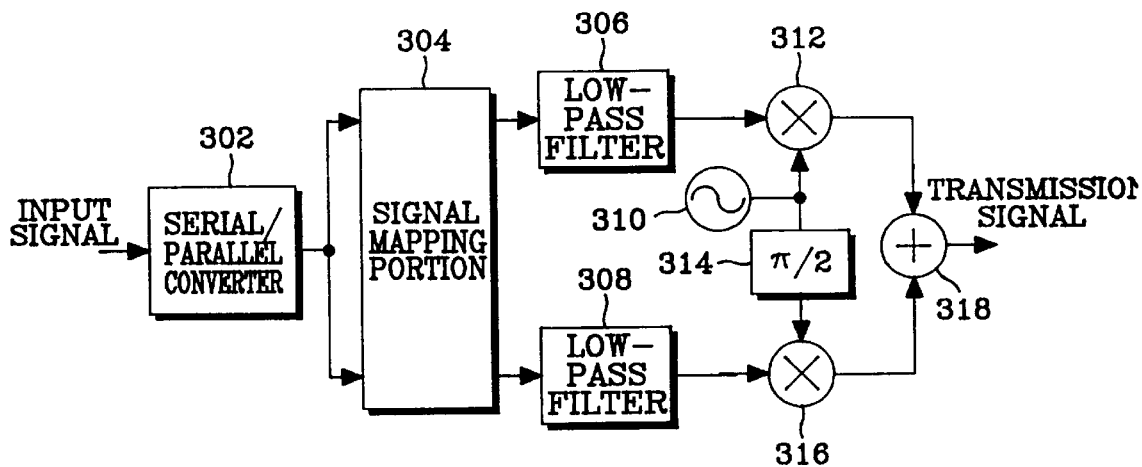
FIG. 3 shows a configuration of a modulator for a binary data transmission system to which the present invention is adopted.

Referring to FIG. 3, the modulator for a binary data transmission system includes low-pass filters 306 and 308. These filters usually use the section of length L as the filter length, and can be implemented by a digital filter having N (L times m) filter taps by oversampling the section m times. This invention may be adopted to low-pass filters 306 and 308 included in the modulator for a binary data transmission system, as well as to all filters taking, as their input, data mapped in ±1 of impulse. In FIG. 3, a signal mapping portion 304 provides a filter input form mapped in ±1 of impulse.

Figure 4:
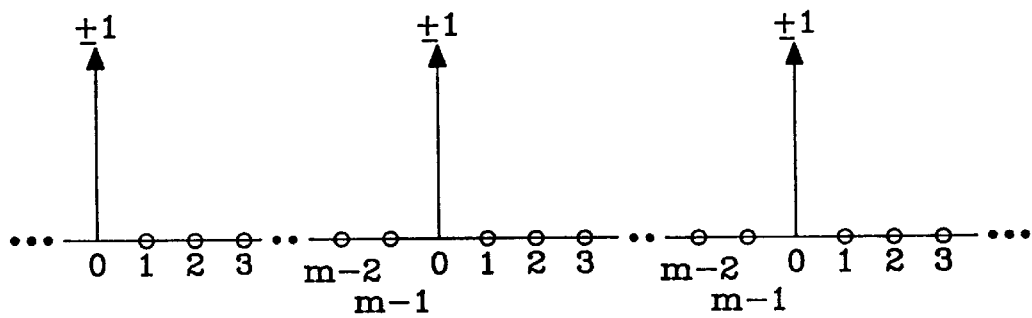
FIG. 4 shows the form of data input to the filter of FIG. 3.

FIG. 4 shows a form of input data applied to low-pass filters 306 and 308, in which signals oversampled m times for one symbol are input. Specifically, the first sample of one symbol has ±1, that is, an actual value mapped by signal mapping portion 304, and m-1 samples are in the form of "0." The input data are applied to low-pass filters 306 and 308 so that L times of multiplication and L-1 times of adding are performed in low-pass filters 306 and 308 for once oversampling, thus obtaining one filter state value. For one symbol, mL times of multiplication and m(L-1) times of adding are performed to obtain m filter state values. If such an FIR filter is implemented in the lookup table mode as shown in FIG. 2, its ROM is required to have a capacity of $2^L$.

The m filter state values output from low-pass filter 306 for one symbol are multiplied, in multiplier 312, by an oscillating carrier output from local oscillator 310. The m filter state values output from low-pass filter 308 for one symbol are multiplied, in multiplier 316, by an oscillating carrier output from local oscillator 310 and phase shifted by $\pi/2$ in phase shifter 314. The results of multiplication in multipliers 312 and 316 are summed in adder 318 and output as a transmission signal.

The configuration and operation of the FIR filter according to the principles of the present invention will be described hereafter in detail with the respective embodiments.

First Embodiment

Figure 5:
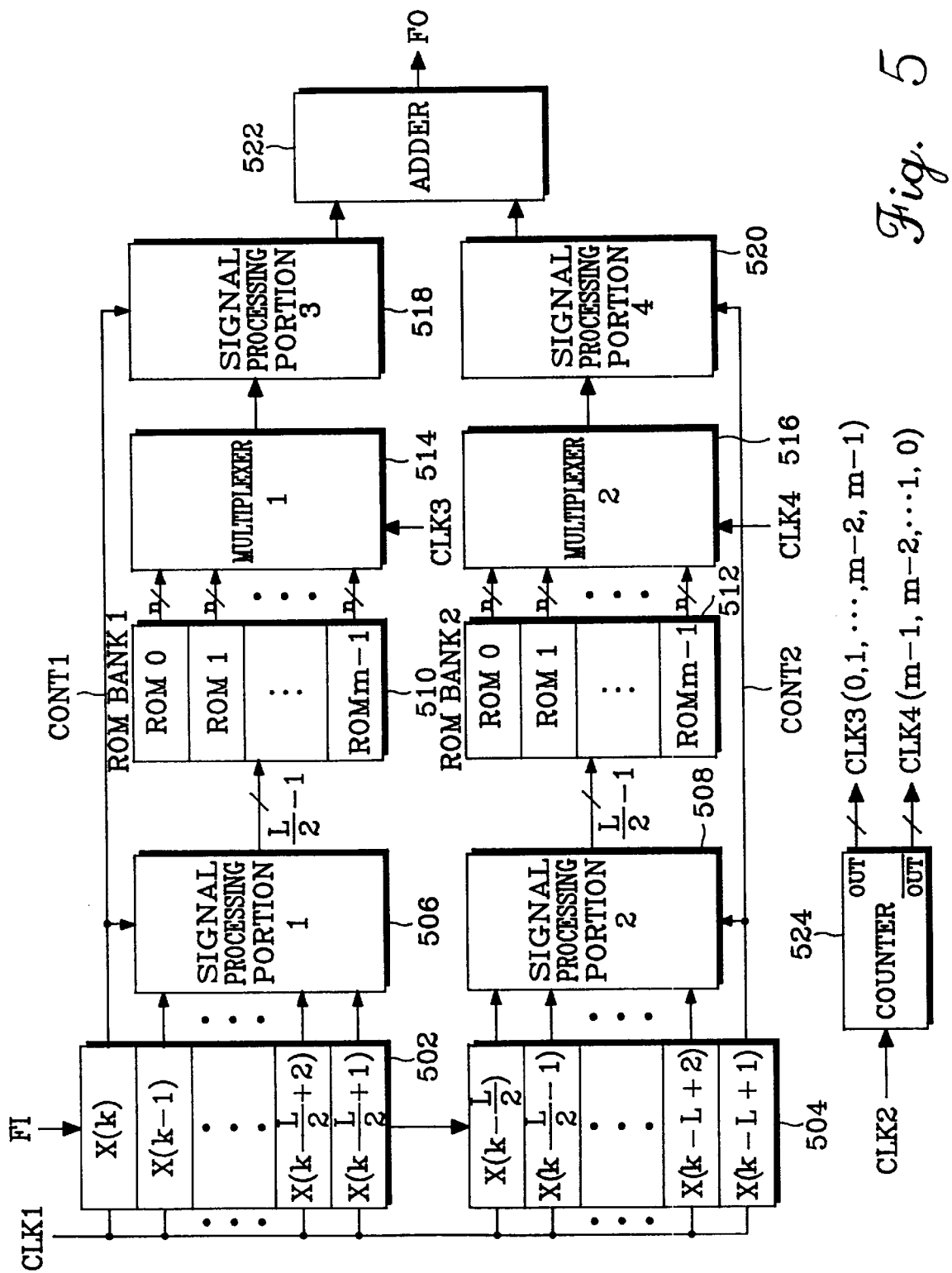
FIG. 5 is a block diagram of a first embodiment of an FIR filter according to the principles of the present invention.

Referring to FIG. 5, the first embodiment of an FIR has delay portions 502 and 504 for delaying data input for every symbol FI. Delay portions 502 and 504 each have L/2 delay devices for temporarily storing data input in response to a first clock CLK1. Each of the delay devices outputs the temporarily stored data to the next delay device in response to a pulse of first clock CLK1. Here, the data bit value X(k) delayed by the first delay device of first delay portion 502 is output as a first control signal CONT1, the data bit value X(k-L+1) delayed by the final delay device of second delay portion 504 is output as a second control signal CONT2. The rest of the delay device of first delay portion 502 provide the output data bit values X(k-1) through X(k-(L/2)-1) a first signal processing portion 506. The rest of the delay device of second delay portion 504 provide the output data bit values X(k-(L/2)) through X(k-L+2) a second signal processing portion 508.

First signal processing portion 506 outputs the bit data output from first delay portion 502 as is, or as ones complemented data, depending on the level of first control signal CONT1 over (L/2)-1 parallel data bit lines to a first ROM bank 510. Second signal processing portion 508 outputs the bit data output from second delay portion 504 as is, or as ones complemented data, depending on the level of second control signal CONT2 over (L/2)-1 parallel data bit lines to a second ROM bank 512. The (L/2)-1 data bits output from first signal processing portion 506 are provided as address data for first ROM bank 510, and the (L/2)-1 data bits output from second signal processing portion 508 are provided as address data for second ROM bank 512. First and second ROM banks 510 and 512 store filter state values, and each ROM bank is comprised of m ROMs, corresponding to oversampling rate m.

A first multiplexer 514 multiplexes the filter state values output from the ROMs addressed in first ROM bank 510 according to a third clock CLK3, and a second multiplexer 516 multiplexes the filter state values output from the ROMs addressed in second ROM bank 512 according to a fourth clock CLK4. First and second multiplexers 514 and 516 multiplex sequentially from ROM 0 to ROM m-1 of ROM banks 510 and 512, respectively, in response to third and fourth clocks CLK3 and CLK4. A third signal processing portion 518 outputs the data output from first multiplexer 514 as is, or as twos complemented data, depending on the level of first control signal CONT1. A fourth signal processing portion 520 outputs the data output from second multiplexer 516 as is, or as twos complemented data, depending on the level of second control signal CONT2. An adder 522 sums the data output from third signal processing portion 518 and the data output from fourth signal processing portion 520, and outputs filtered output data F0.

The configuration of the FIR filter shown in FIG. 5 may be thought to be similar to that of the lookup table FIR filter shown in FIG. 2 because the input data is output as address data for the ROM, and, of the filter state values stored in the ROM, the value stored in the area of the generated address is output as filter output data. Their vital difference, however, is that the lookup table FIR filter of FIG. 2 has only one delay line, but the FIR filter of FIG. 5 uses a delay line separated into two. When the L-step delay line is separated into two, the number of combination of address can be reduced to $2^{L/2}+2^{L/2}$ from $2^L$. For example, if L is 6, in the lookup table FIR filter, the number of combination of address is $2^6$ (=64), but in the FIR filter of FIG. 5, the combined number of addresses is $2^{6/2}+2^{6/2}$ (=$2^3+2^3$)=16. By separating the delay line into two, the number of addresses can be reduced, and the ROM capacity be reduced in turn.

Dissimilar to the lookup table FIR filter, the FIR filter of FIG. 5 further comprises first and second signal processing portions 506 and 508 for performing a ones complement on the addresses output from delay portions 502 and 504, and third and fourth signal processing portions 518 and 520 for performing a twos complement on the filter state values output from the ROM banks. These components for complement are provided to output the same filter state values even with the capacity of ROM being reduced into half. More specifically, in a ROM divided into two storage areas according to the MSB of the address, the address of one storage area (region A) is symmetric to that of the other storage area (region B). For this reason, this embodiment has a ROM only of region A, and generates addresses only for region A. However, in order to obtain the same filter effect as in the case of using a ROM prior to reducing its capacity into half, the ones complement is performed to the address of region B (this complemented address is the same as the address of region A), and the twos complement is performed on the data output from the ROM, corresponding to the thus processed address. As a result, the same filtering effect as using a ROM prior to reducing its capacity into half can be obtained even though its capacity is reduced into half.

Figure 6:
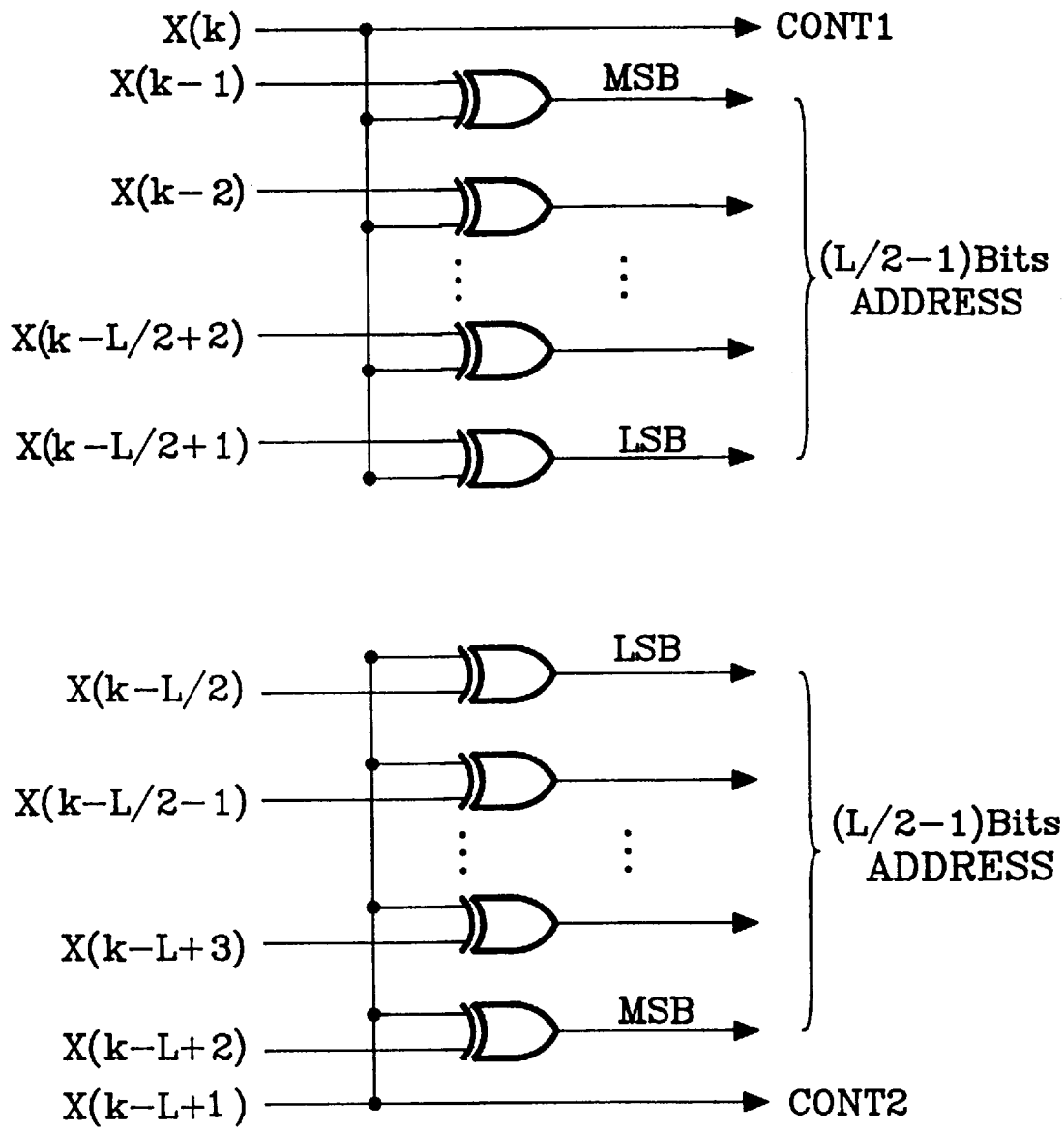
FIG. 6 shows a detailed configuration of first and second signal processing portions of FIG. 5.

FIG. 6 shows a detailed configuration of first and second signal processing portions 506 and 508 of FIG. 5. Referring to FIG. 6, first signal processing portion 506 comprises a plurality of two input exclusive OR gates one input of which is the data, i.e., first control signal CONT1, stored in the first delay device of first delay portion 502, and the other input of each XOR gate is the data stored in the rest of the delay devices of first delay portion 502, respectively. Second signal processing portion 508 also comprises a plurality of two input exclusive OR gates. For one input of the XOR gates forming second signal processing portion 508, the data, i.e., second control signal CONT2, stored in the final delay device of second delay portion 504 is provided, and the other input of each XOR gate is the data stored in the rest of the delay devices of second delay portion 504, respectively. These multiple XOR gates output the output values of the delay portions through the ones complement operation when the value of the control signal is "1", but directly output the output values of the delay portions as is when the value of the control signal is "0".

Figure 7:
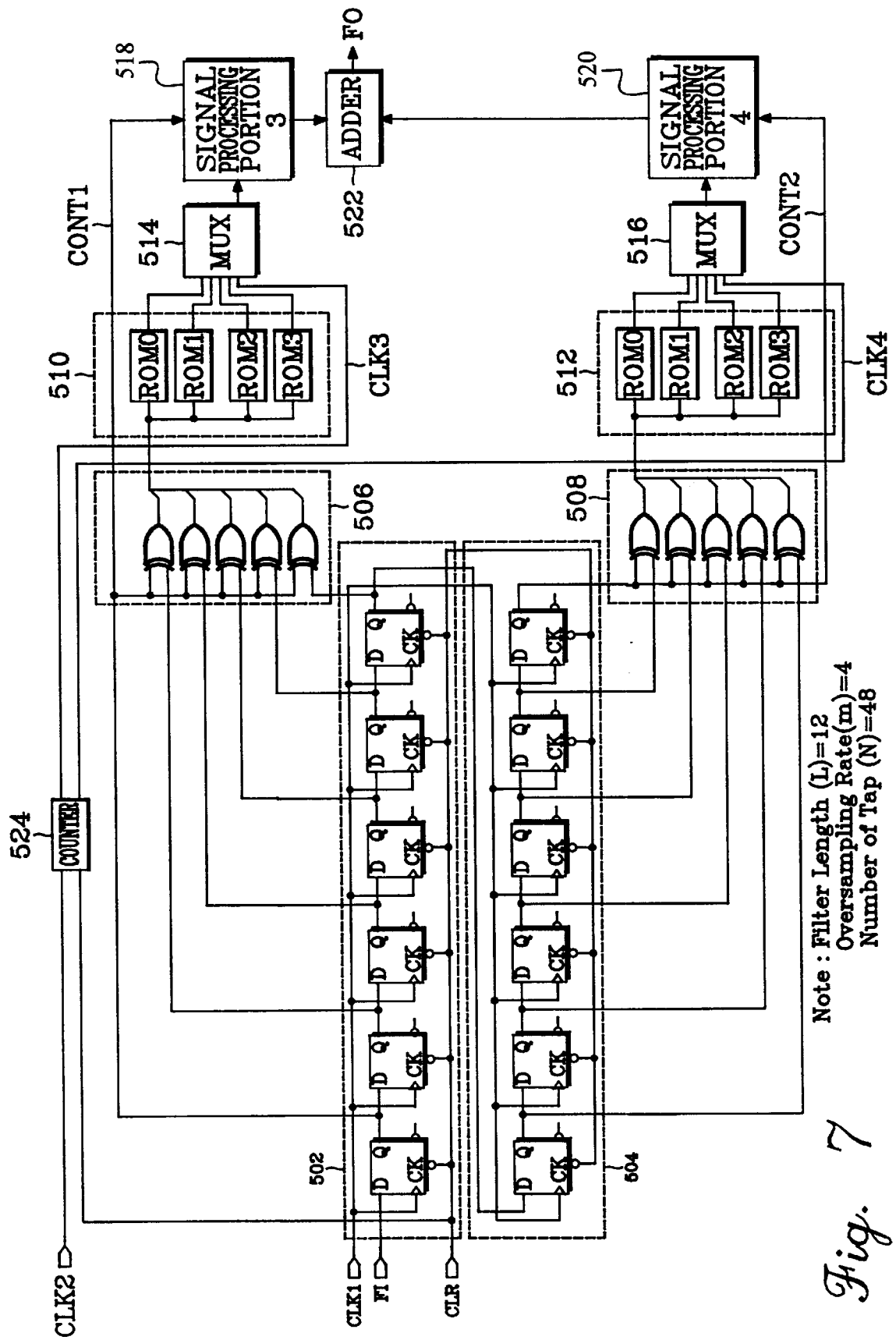
FIG. 7 is a detailed circuit diagram of the FIR filter shown in FIG. 5.

FIG. 7 is an example of the FIR filter shown in FIG. 5, in which oversampling rate m is 4, the length of filter L is 12, and the number of tap N is 48. Referring to FIG. 7, delay portions 502 and 504 each are made up with six (L/2) delay devices, i.e., D flip-flops, according to the length of filter. Signal processing portions 506 and 508 each comprise five (L/2-1) exclusive OR gates. ROM banks 510 and 512 each comprise four (m) ROMs according to the oversampling rate.

Figure 8:
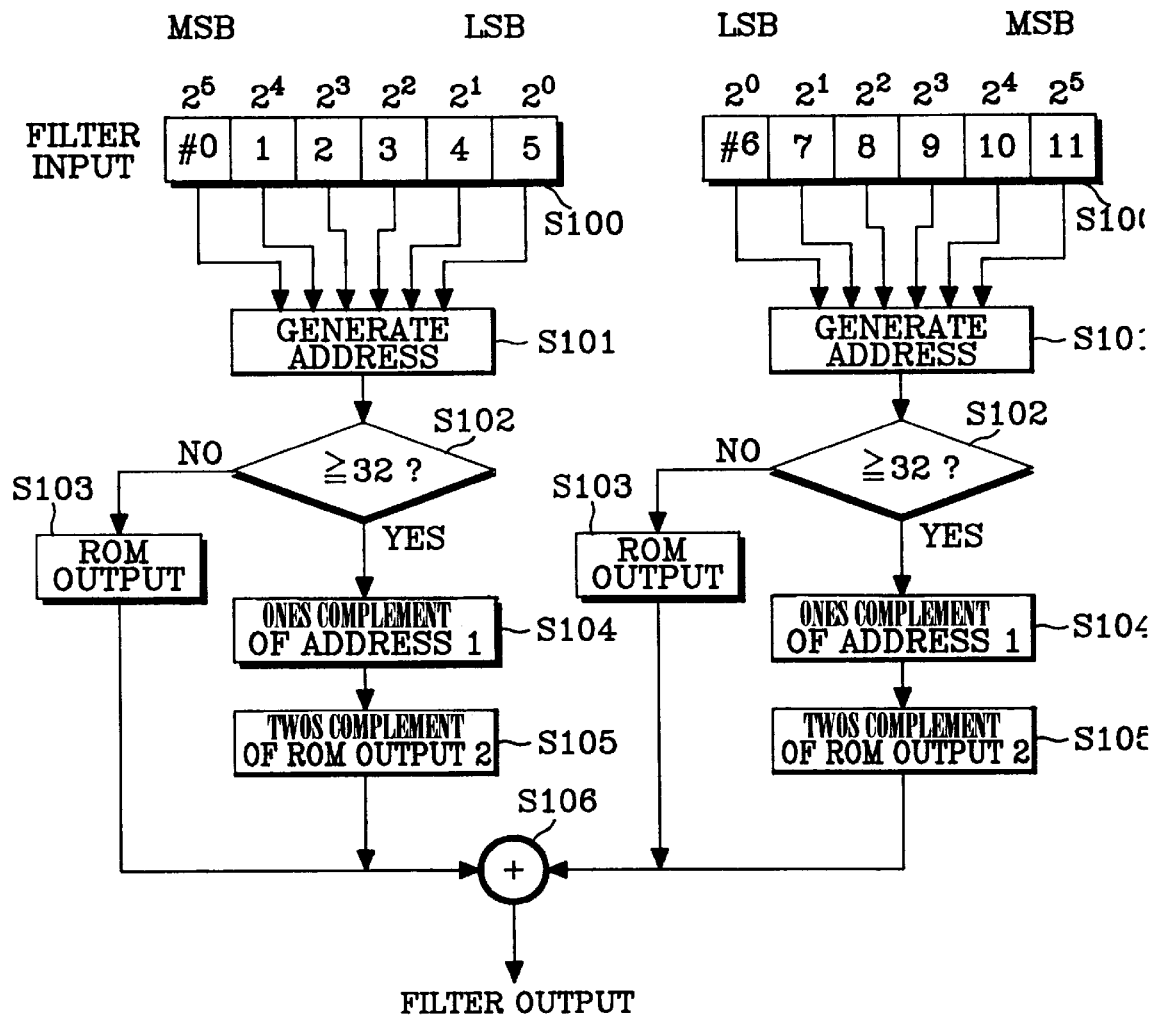
FIG. 8 is a flowchart alternatively illustrating the operation of the FIR filter.

The flowchart of FIG. 8 illustrates the operation of the FIR filter according to the principles of the present invention.

Referring now to FIG. 8, an example of the operation of the FIR filter will be alternately explained. Step S100 illustrates the input of data into the respective delay devices 0–5 and 6–11 of the two delay portions. The data stored in the delay portions are then used to generate, step S101, addresses for accessing filter state values stored in the respective ROMs. If the generated addresses have a value greater than or equal to 32, step S102, then the most significant bit of the outputs of delay portions will have a bit value of "1". Accordingly, the address, if any, having the value equal to or greater than 32 will be ones complemented, step S104, prior to addressing the ROM banks. The address, if any, not having a value equal to or greater than 32 will be used to address the ROMs as is, i.e., without being ones complemented, step S103. The filter state value output by the ROM addressed by the ones complemented address will be output an then changed according to a twos complement operation, step S105. The filter state value output by the ROM addressed by the as is address will be output as is, i.e., not twos complemented, step S103. The filter state values thus output are then combined by an addition or summation operation, step S106, to provide output filter data.

Figure 9:
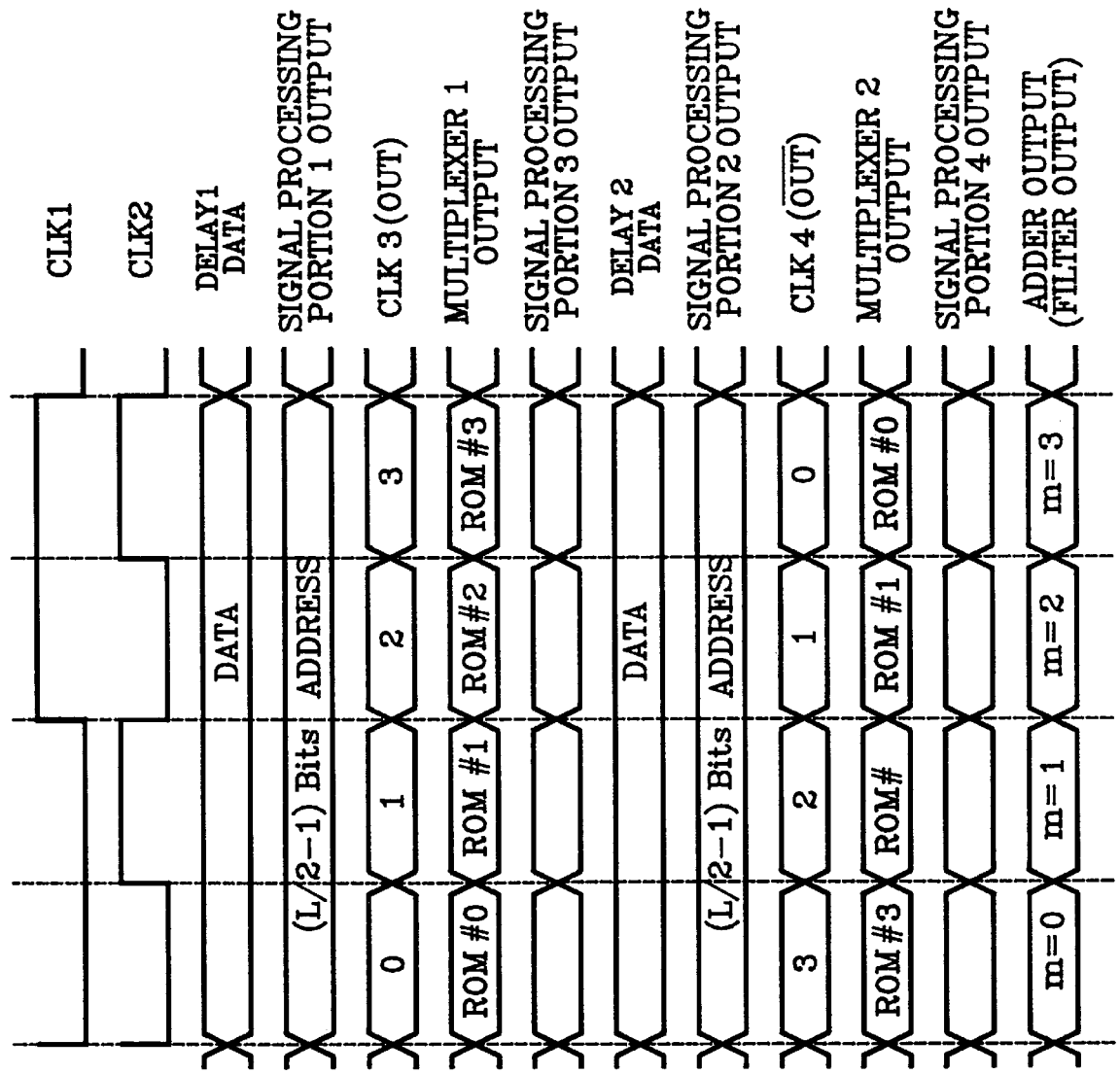
FIGS. 9A–9M are timing diagrams of the FIR filter of FIGS. 5 and 7.

FIG. 9 illustrates the timings of the signals processed in the FIR filter shown in FIG. 7. FIG. 9A shows first clock CLK1, which is equal to the symbol rate, which provides clock pulses to the clock terminals of the D type flip-flops forming delay portions 502 and 504. FIG. 9B shows second clock, which has a rate twice the symbol rate, which is supplied to counter 524. The last bit input to delay portion 502 is used as a control signal CONT1 and therefore is not output as address data. The first bit input to delay portion 504 is used as control signal CONT2, and therefore, is not output as address data. The rest of the data stored in delay portions 502 and 504, FIGS. 9C and 9H, respectively, are respectively processed by signal processing portions 506 and 508 in response to control signals CONT1 and CONT2, respectively, and output as address data having (L/2)–1 bits, FIGS. 9D and 9J, respectively. ROM banks 510 and 512 are addressed by the address data, FIGS. 9D and 9J, respectively to output filter values. Counter 524 simultaneously performs an up counting operation and a down counting operation to generate clock CLK3, FIG. 9E, and clock CLK4, FIG. 9J, respectively. Multiplexer 514 has an output terminal selectively connected in a sequential manner to the outputs of ROM0 through ROM3 in ROM bank 510 in response to clock CLK3 as shown in FIG. 9F. Multiplexer 516 has an output terminal selectively connected in a sequential manner to the outputs of ROM3 through ROM0 in ROM bank 512 in response to clock CLK4 as shown in FIG. 9K. The ROM data output in the sequence of FIGS. 9F and 9K are applied to third and fourth signal processing portions 518 and 520, respectively. Third signal processing portions 518 and 520 output the applied ROM data through a twos complement operation, or as is, according to the level of control signals CONT1 and CONT2, FIGS. 9G and 9L, respectively. The twos complement is performed by signal processing portion 518 when the level of control signal CONT1 has a value of "1". The twos complement is performed by signal processing portion 520 when the level of control signal CONT2 has a value of "1". Accordingly, first and second signal processing portions 502 and 504 may perform the ones complement on the data output by first and second delay portions 502 and 504, to generate address data, and third and fourth signal processing portions 518 and 520 may perform the twos complement on the filter data output by the ROMs. Therefore, the same effect as obtained in the FIR filter of FIG. 2 having the larger capacity ROM can be obtained by the present invention having the reduced capacity ROM.

The ROM data processed and output from third and fourth signal processing portions 518 and 520 are summed in adder 522, and output, FIG. 9M, as filter output data F0. This filter output data F0 corresponds to 4 (oversampling rate) filter values output while one bit of filter input data FI is input and one period of symbol rate is maintained. When the oversampling rate m is 0, ROM0 data of first ROM bank 510 and ROM3 data of second ROM bank 512 are summed, and when the oversampling rate m is 1, ROM1 data of first ROM bank 510 and ROM2 data of second ROM bank 512 are summed. When the oversampling rate m is 2, ROM2 data of first ROM bank 510 and ROM1 data of second ROM bank 512 are summed, and when the oversampling rate m is 3, ROM3 data of first ROM bank 510 and ROM0 data of second ROM bank 512 are summed.

Regarding the FIR filter of the present invention, the required ROM capacity is $2 \times 2^{L/2-1}$ times m ($=2^{L/2}$ times m). This indicates that the present invention uses a ROM of a reduced capacity as compared with the ROM capacity $2^L$ times m required in the conventional FIR filter of FIG. 2.

Meanwhile, as many filter values output from one symbol rate as oversampling rate m are fixed to a corresponding address of first and second ROM banks 510 and 512. The filter coefficients multiplied by the actual data values in m times calculation of the filter state values are fixed to corresponding addresses of first and second ROM banks 510 and 512. These filter coefficients are fixed to corresponding addresses of first and second ROM banks 510 and 512, as shown in the following Table 1.

TABLE 1

|  | First ROM bank(510) | Second ROM bank (512) |
| --- | --- | --- |
| m=0 | h(0), h(4), h(8), h(12), h(16), h(20) | h(24), h(28), h(32), h(36), h(40), h(44) |
| m=1 | h(1), h(5), h(9), h(13), h(17), h(21) | h(25), h(29), h(33), h(37), h(41), h(45) |
| m=2 | h(2), h(6), h(10), h(14), h(18), h(22) | h(26), h(30), h(34), h(38), h(42), h(46) |
| m=3 | h(3), h(7), h(11), h(15), h(19), h(23) | h(27), h(31), h(35), h(39), h(43), h(47) |

Table 1 corresponds to a case in which oversampling rate m is 4 and the number of filter taps is 48.

Figure 10:
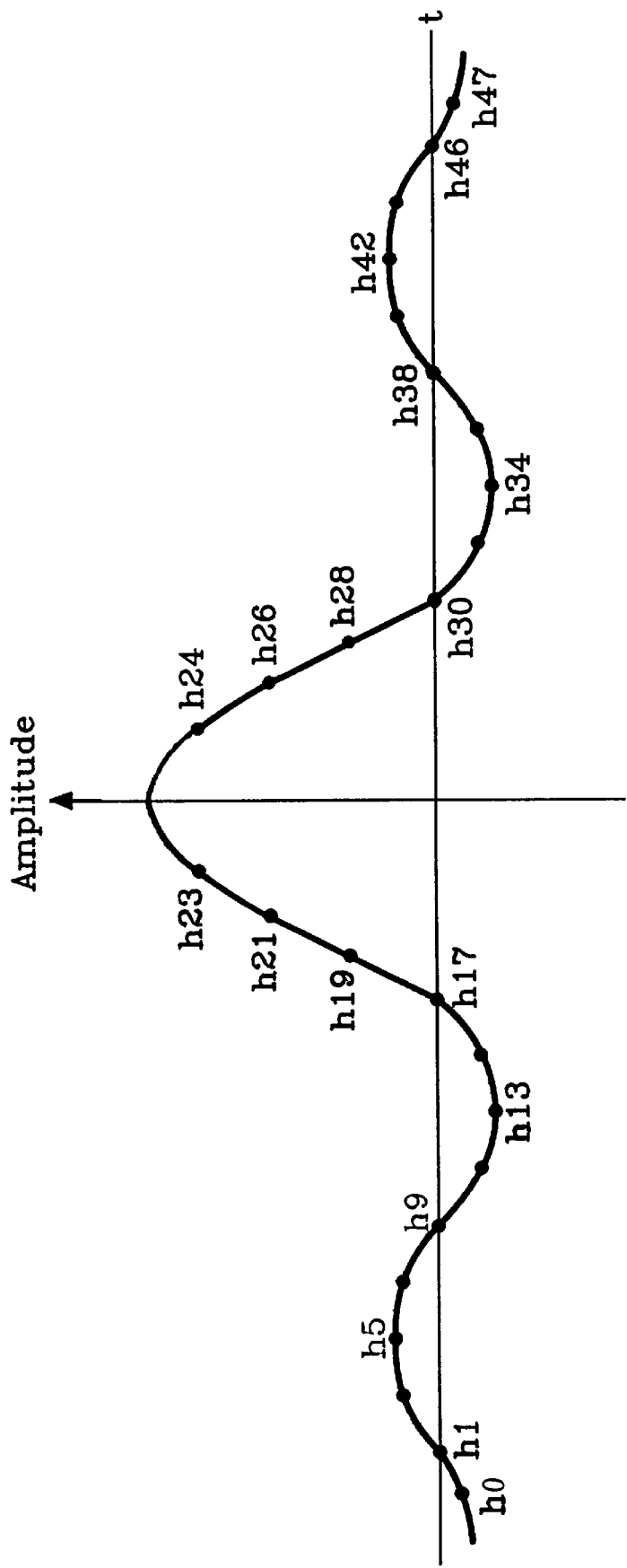
FIG. 10 shows a general FIR filter characteristic.

In a general digital filter, the filter coefficients are designed to be symmetric, as shown in FIG. 10. This is because it is generally desirable that the digital filter be designed to have a linear phase characteristic. Referring to FIG. 10, when there are 48 filter coefficients from h0 to h47, the filter coefficients from h0 to h23 are symmetric to those from h47 to h24 at the reference of amplitude axis. In other words, filter coefficient h0 is as large as h47, h5 is as large as h42, h17 is as large as h30, and h23 is as large as h24. As a result, Table 1 can be shown as in Table 2.

TABLE 2

|  | First ROM bank(510) | Second ROM bank (512) |
| --- | --- | --- |
| m=0 | h(0), h(4), h(8), h(12), h(16), h(20) | h(23), h(19), h(15), h(11), h(7), h(3) |
| m=1 | h(1), h(5), h(9), h(13), h(17), h(21) | h(22), h(18), h(14), h(10), h(6), h(2) |
| m=2 | h(2), h(6), h(10), h(14), h(18), h(22) | h(21), h(17), h(13), h(9), h(5), h(1) |
| m=3 | h(3), h(7), h(11), h(15), h(19), h(23) | h(20), h(16), h(12), h(8), h(4), h(0) |

In Table 2, it is noted that the filter coefficients of ROM bank 510 for m=0 are in the reverse order with respect to those of ROM bank 512 for m=3. The filter coefficients of ROM bank 510 for m=1 are in the reverse order to those of ROM bank 512 for m=2. The filter coefficients of ROM bank 510 for m=2 are in the reverse order with respect to those of ROM bank 512 for m=1. The filter coefficients of ROM bank 510 for m=3 are in the reverse order to those of ROM bank 512 for m=0.

In other words, referring to Tables 1 and 2, the filter state values stored in ROM bank 512 and output by the address generated by delay portion 504 can be obtained from the filter state values stored in ROM bank 510. Therefore, all desired filter state values can be found only using one of ROM banks 510 and 512. Using this result, the ROM capacity required by the FIR filter can be reduced more. The following second and third embodiments deal with FIR filters implemented according to the above result.

Second Embodiment

Figure 11:
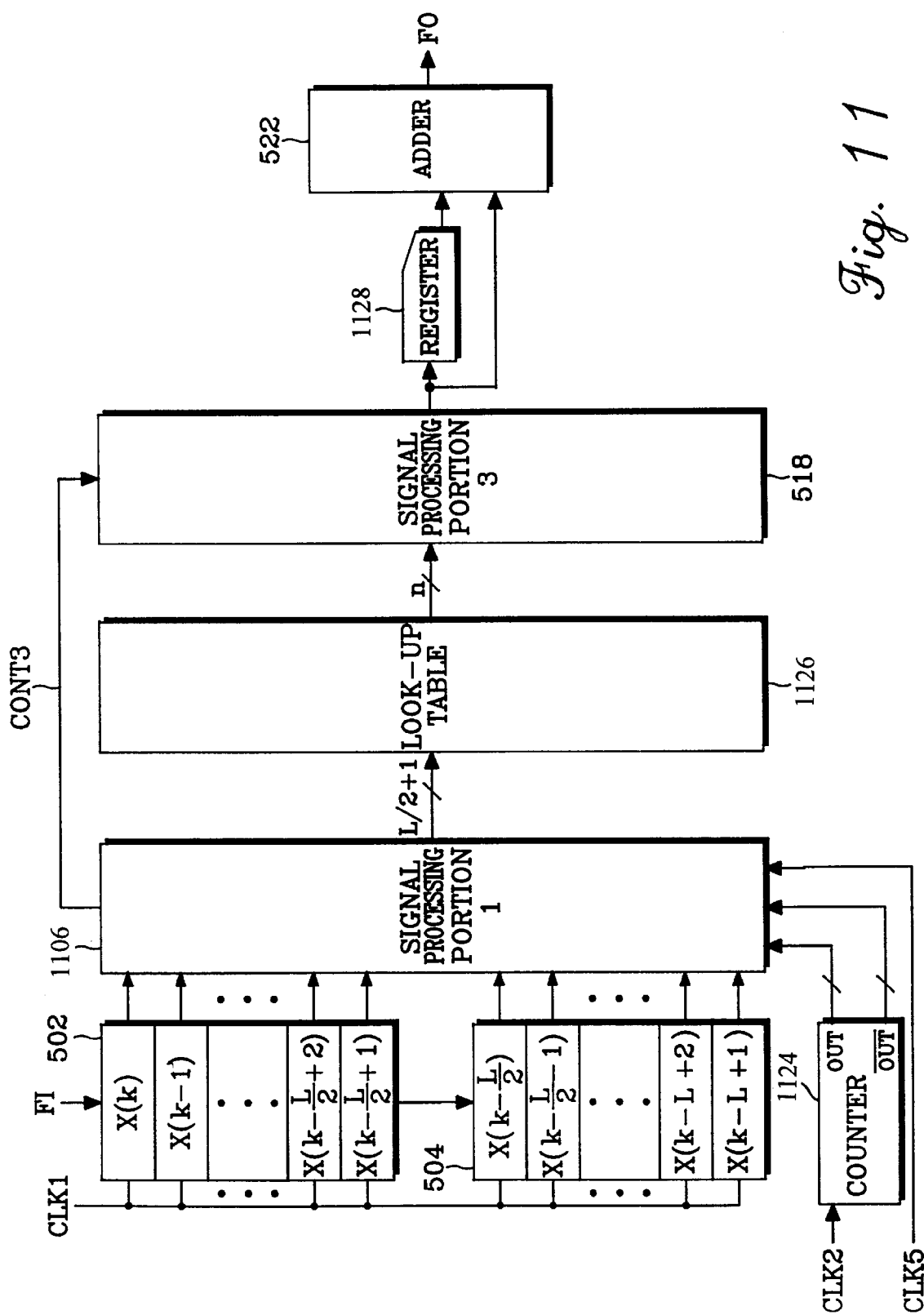
FIG. 11 is a block diagram of a second embodiment of the FIR filter according to the principles of the present invention.

Referring to FIG. 11, another embodiment of the present invention comprises first delay portion 502, second delay portion 504, and adder 522 as discussed with respect to the first embodiment. Counter 524 is replaced by counter 1124. Signal processing portions 506 and 508 are replaced by a single signal processing portion 1106, further described with respect to FIG. 12. ROM banks 510 and 512 are reduced to a lower capacity ROM forming a single look-up table 1126. In addition, first and second multiplexers 514 and 516 and signal processing portions 518 and 520 are reduced to single processing portion 518 and a register 1128 to sharply reduce the size of the whole hardware of the FIR filter.

In order to obtain the same FIR filtering effect by using one lookup table instead of two ROM banks and eliminating first and second multiplexers 514 and 516, a fifth clock CLK5 four times as large as the symbol rate, a different signal processing operation by signal processing portion 1106, a lookup table of $2^{L/2+1}$ capacity, and a register 1128 are used in the embodiment of FIG. 11. In this embodiment, signal processing portion 1106 receiving fifth clock CLK5 is formed as shown in FIG. 12.

Figure 12:
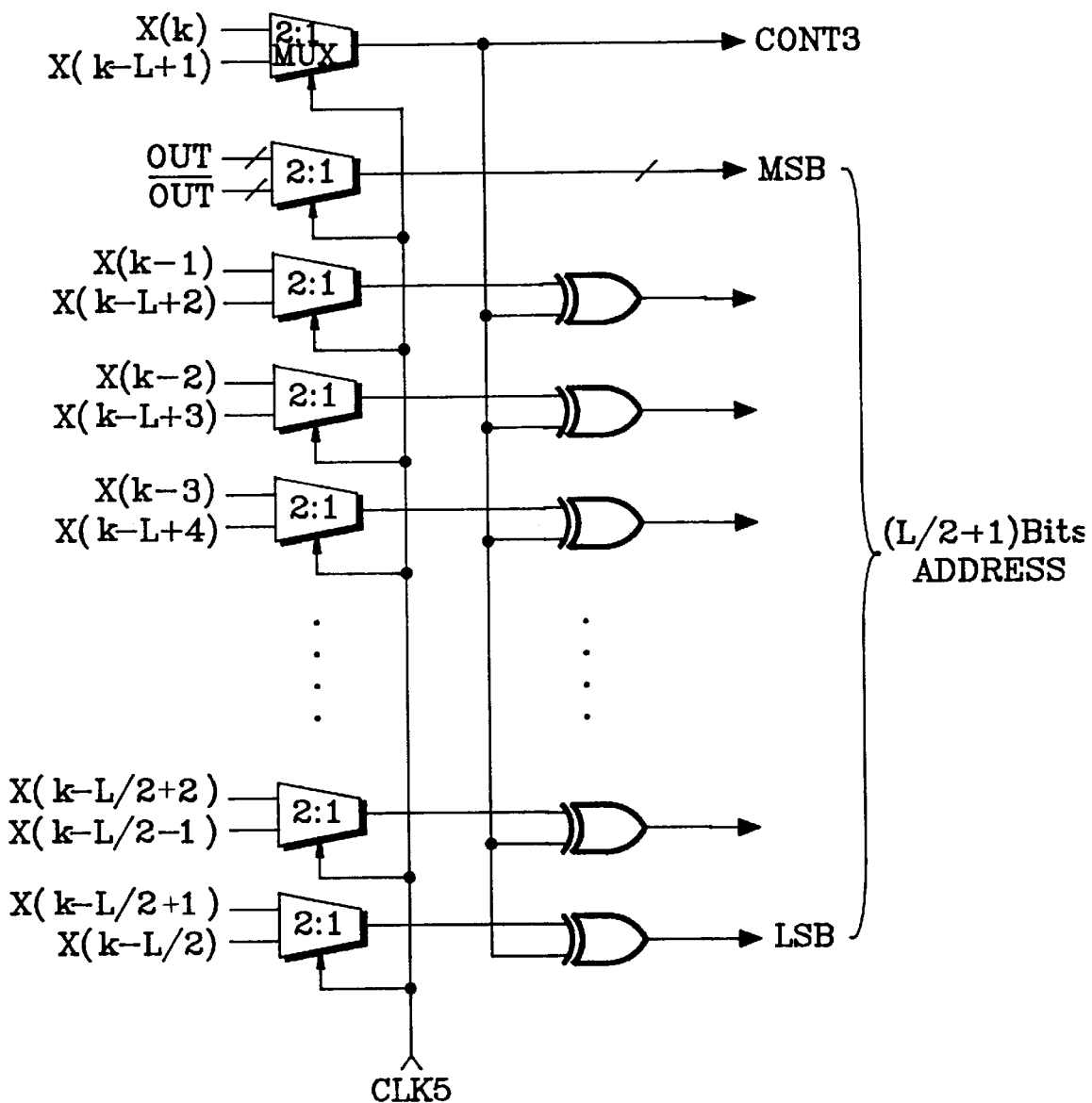
FIG. 12 shows a detailed configuration of the signal processing portion of FIG. 11.

Referring to FIG. 12, signal processing portion 1106 receives fifth clock CLK5, signal OUT and signal $\overline{OUT}$, and the outputs of first and second delay portions 502 and 504. Signal OUT and signal $\overline{OUT}$ are each signals comprised of two bits which output when clock CLK2 two times as large as the symbol rate is counted according to oversampling rate m in counter 1124. Signal processing portion 1106 comprises (L/2)+1 2:1 multiplexers and L/2 exclusive OR gates. To one 2:1 multiplexer, signal OUT and signal $\overline{OUT}$ are applied from counter 1124, and to the other L/2 2:1 multiplexers, the output values of respective delay devices of first and second delay portions 502 and 504, which are symmetric to each, other are applied. Here, the meaning of the symmetry of one delay device of first delay portion 502 and one delay device of second delay portion 504 can be known from the contents of Table 2.

For instance, the output value X(k) of the first delay device of first delay portion 502 and the output value X(k−L+1) of the final delay device of second delay portion 504 which are symmetric are applied as the inputs of one 2:1 multiplexer. The output of the 2:1 multiplexer receiving values X(k) and X(k−L+1) is control signal CONT3, which is applied as one input of the L/2 exclusive OR gates and to third signal processing portion 518. The output of the 2:1 multiplexer receiving signal OUT and signal $\overline{OUT}$ is applied as the two most significant bits (MSB) of the address for accessing lookup table 1126. The outputs of the rest of multiplexers are applied as second inputs of the L/2 exclusive OR gates which generate the rest of the bits of the address for accessing lookup table 1128. The operation of the respective multiplexers is controlled by the fifth clock CLK5.

The L/2+1 bit address generated by signal processing portion 1106 constructed as in FIG. 12 is provided to lookup table 1126 so as to output the filter state values stored in a corresponding address. Control signal CONT3 generated by signal processing portion 1106 is applied to third signal processing portion 518 so as to control third signal processing portion 518's twos complement operation.

The operation of the second embodiment of the present invention including signal processing portion 1106 constructed as in FIG. 12 will be performed according to the timings shown in FIGS. 13A–13L. It should be noted that the operation of the second embodiment FIR filter is explained wherein the oversampling rate m is 4, the length of filter L is 12, and the number of taps is 48.

FIG. 13A shows first clock CLK1, which is equal to the symbol rate, which provides clock pulses to the delay elements forming delay portions 502 and 504. FIG. 13B shows second clock CLK2 having a rate twice the symbol rate which is supplied to counter 1124. FIG. 13C shows clock CLK5 having a rate four times the symbol rate which is applied to plurality of 2:1 multiplexers of signal processing portion 1106. Suppose that one bit of filter input data FI is applied to first delay portion 502 of FIG. 11, along with the previously input 5 bits of data in first delay portion 502 and the 6 bits of data in second delay portion 504 two data lines of 6 bits each are thus formed. These data lines are maintained for one period of clock CLK1, as shown in FIGS. 13D and 13E. Counter 1124 performs a counting operation in accordance with the oversampling rate after receiving clock CLK2. As a result, signal OUT indicative of the sequence of 0-1-2-3 is output as shown in FIG. 13F, and signal $\overline{OUT}$ indicative of the sequence of 3-2-1-0 is output as shown in FIG. 13G. In response to signals OUT and $\overline{OUT}$ and fifth clock CLK5, first signal processing portion 1106 generates a L/2+1 bit address indicative of the sequence 0-3-1-2-2-1-3-0 shown in FIG. 13H. Then, the filter state value stored in the area of lookup table 1126 corresponding to the thus generated address is ROM data selected and output in the sequence 0-3-1-2-2-1-3-0, as shown in FIG. 13I, to signal processing portion 518. Signal processing portion 518 receives the filter state value from lookup table 1126, and provides the filter state value as is to register 1128 and adder 522 when control signal CONT3 has a value of "0", or performs a twos complement operation on the filter state value and outputs the twos complemented filter state value when control signal CONT3 has a value of "1". The filter state value output from signal processing portion 518 is in the sequence of 0-3-1-2-2-1-3-0, as shown in FIG. 13J. Here, the ROM data in accordance with "0" and "3" and ROM data in accordance with "1" and "2" are the same as in Table 2. The filter state value output by signal processing portion 518 is stored temporarily in register 1128, and this stored value is output as shown in FIG. 13K. The stored value output by register 1128 and the filter state value output by signal processing portion 518 are summed by adder 522, resulting in the output as shown in FIG. 13L. Note that the filter state value according to this result is output in the same sequence as in FIG. 9M.

Regarding the second embodiment of the present invention, the same filtering effect as obtained using the FIR filter of FIG. 5 can be obtained. In this embodiment, the required capacity of the ROM forming look-up table 1126 is $2^{(L/2)+1}$ times m, which is reduced as compared with the capacity $2^L$ times m of the ROM required in the conventional FIR filter. However, as compared with the FIR filter shown in FIG. 5, a relatively large capacity of ROM is required.

Third Embodiment

Figure 14:
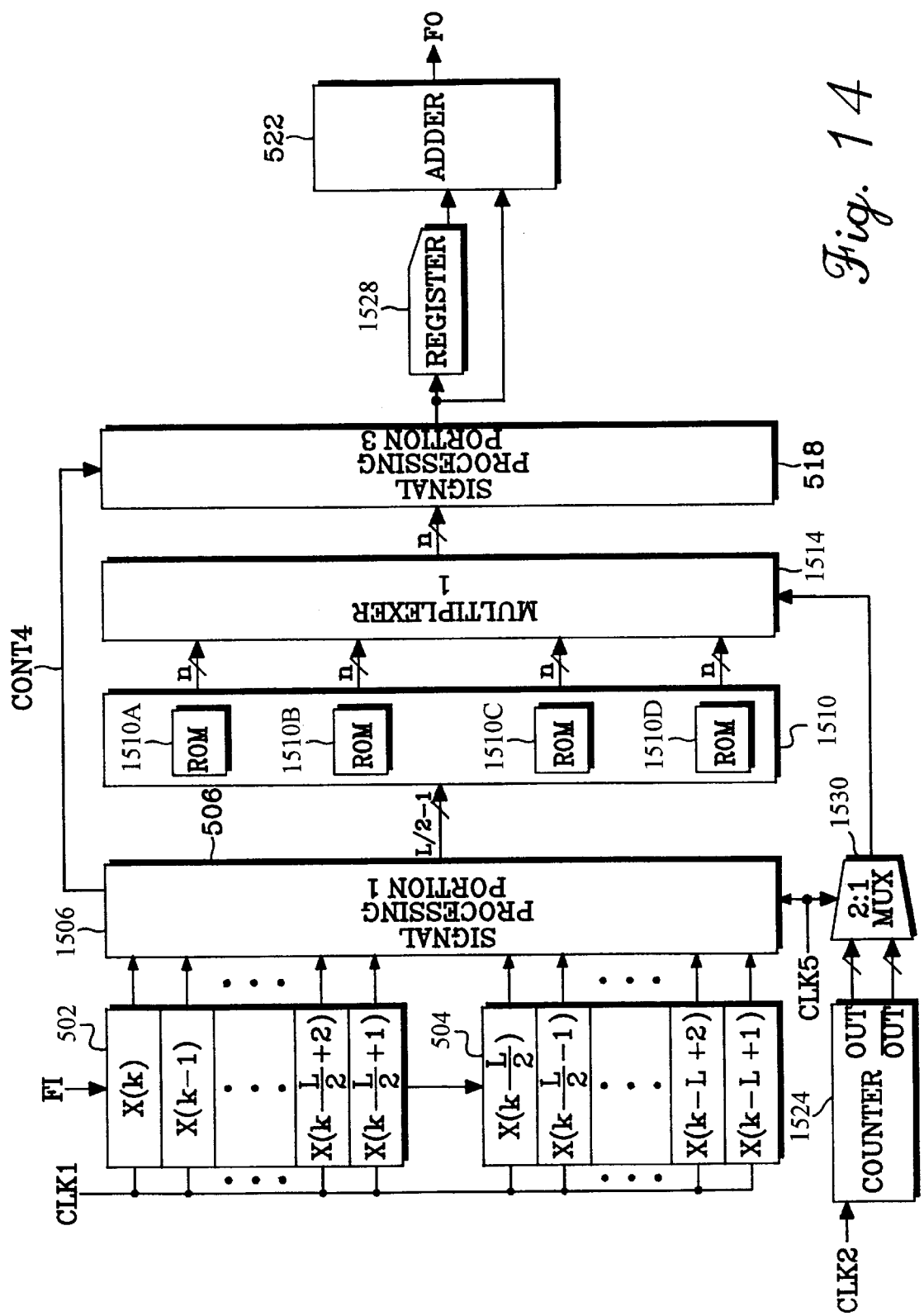
FIG. 14 is a block diagram of a third embodiment of the FIR filter according to the principles of the present invention.

Referring to FIG. 14, another embodiment of the present invention comprises first delay portion 502, second delay portion 504, and adder 522 as discussed with respect to the first embodiment. Counter 524 is replaced by counter 1524. Signal processing portions 506 and 508 are replaced by a single signal processing portion 1506, further described with respect to FIG. 15. ROM banks 510 and 512 are replaced by a single ROM bank 1510 comprising a plurality of ROMs 1510A–1510D. This can reduce ROM capacity to be less than the ROM capacity of the FIR filter shown in FIG. 5. In addition, first and second multiplexers 514 and 516 and signal processing portions 518 and 520 are reduced to a single multiplexer 1514, a single processing portion 518 and a register 1528 to reduce the size of the whole hardware of the FIR filter.

In order to obtain the same FIR filtering effect by using one ROM bank 1510 and one multiplexer instead of two ROM banks and two multiplexers, the third embodiment utilizes a fifth clock CLK5 four times as large as the symbol rate, a different signal processing operation by signal processing portion 1506 and a register 1528 are used. This fifth clock CLK5 is applied to first signal processing portion 1506, and to a 2:1 multiplexer 1530 which receives the output signals OUT and $\overline{\text{OUT}}$ of counter 1524. Signals OUT and $\overline{\text{OUT}}$ are signals output as second clock CLK2 is counted according to oversampling rate m in counter 1524. In this embodiment, first signal processing portion 1506 receiving fifth clock CLK5 is formed as shown in FIG. 15.

Figure 15:
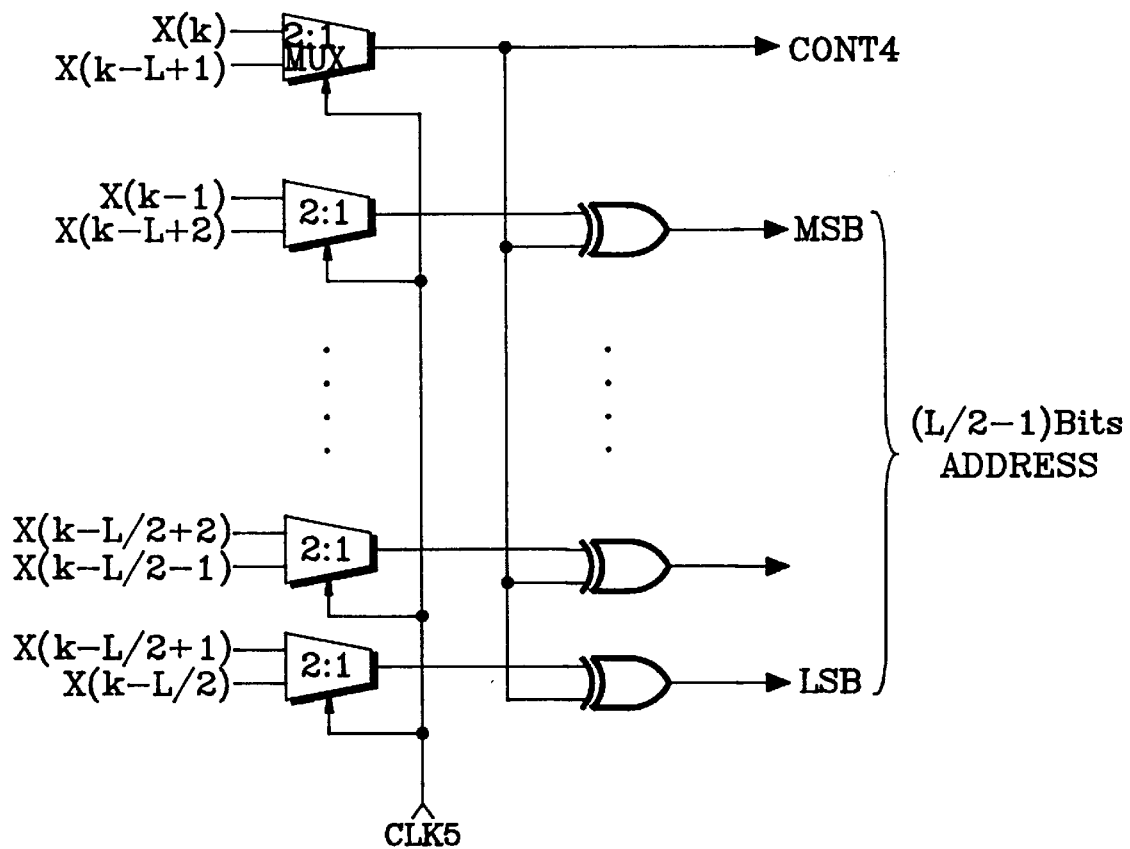
FIG. 15 shows a detailed configuration of the signal processing portion of FIG. 14.

Referring to FIG. 15, first signal processing portion 506 receives fifth clock CLK5 as well as the outputs of first and second delay portions 502 and 504. First signal processing portion 506 comprises L/2 2:1 multiplexers and L/2−1 exclusive OR gates. To the respective L/2 2:1 multiplexers, the output value of one delay device of first delay portion 502 and the output value of one delay device of second delay portion 504 which are symmetric to each other are applied. Here, the meaning of the symmetry of one delay device of first delay portion 502 and one delay device of second delay portion 504 can be known from the contents of Table 2. For instance, the output value X(k) of the first delay device of first delay portion 502 and the output value X(k-L+1) of the final delay device of second delay portion 504 which are symmetric are applied as the inputs of one 2:1 multiplexer. The output of the 2:1 multiplexer receiving values X(k) and X(k-L+1) is fourth control signal CONT4, which is applied as one input of the L/2−1 exclusive OR gates and to third signal processing portion 518. The rest multiplexers excluding the 2:1 multiplexer outputting fourth control signal CONT4 receive the output value of one delay device of first delay portion 502 and the output value of one delay device of second delay portion 504 which are symmetric, excluding X(k) and X(k-L+1), and multiplex the received values according to fifth clock CLK5. The output values of these multiplexers are applied as the other input of the L/2−1 exclusive OR gates one input of which is the fourth control signal CONT4. The L/2−1 exclusive OR gates generate L/2−1 bit address for accessing the filter state value stored in ROM bank 510.

The L/2−1 bit address generated by first signal processing portion 506 constructed as in FIG. 15 is provided to ROM bank 510 of four ROMs 510A–510D according to the oversampling rate so as to output the filter state values stored in a corresponding address. The fourth control signal CONT4 generated by first signal processing portion 506 is given to third signal processing portion 518 so as to control the third signal processing portion 518's twos complement.

The operation of the third embodiment of the present invention including signal processing portion 506 constructed as in FIG. 15 will be performed according to the timings shown in FIGS. 16A–16L. It should be noted that the operation of the FIR filter is explained with a case in which oversampling rate m is 4, the length of filter L is 12, and the number of tap is 48.

Suppose that one bit of filter input data FI is applied to first delay portion 502 of FIG. 14, first and second delay portions 502 and 504 form 6 bits of data line along with previously input 5 bits of data. This data line is maintained for one period of symbol rate clock CLK1, as shown in FIGS. 16D and 13E. Here, counter 524 performs counting in accordance with the oversampling rate after receiving clock CLK2 two times as large as the symbol rate. As a result, signal OUT indicative of the sequence of 0-1-2-3 is output as shown in FIG. 16F, and signal $\overline{\text{OUT}}$ indicative of the sequence of 3-2-1-0 is output as shown in FIG. 16G. 2:1 multiplexer 530 multiplexes signals OUT and $\overline{\text{OUT}}$ according to clock CLK5 four times as large as the symbol rate, and the result is output to multiplexer 514.

In response to clock CLK5, first signal processing portion 1506 generates a L/2−1 bit address indicative of the sequence shown in FIG. 16H. Then, the filter state value, i.e., one ROM data, stored in the area of ROM bank 1510 corresponding to the thus generated address is accessed and output to multiplexer 1514. When the filter state value is accessed and applied from ROM bank 1510, the output signal of 2:1 multiplexer 1530 is applied to multiplexer 1514 so that multiplexer 514 outputs ROM data in accordance with the sequence shown in FIG. 16I. Multiplexer 514 outputs ROM data in the sequence of 0-3-1-2-2-1-3-0 to signal processing portion 518 for one period of the symbol clock rate. Signal processing portion 518 receives the filter state value from ROM bank 510 which and outputs the filter state value as is or after performing a twos complement operation on the filter state value in accordance with the value of control signal CONT4 generated by signal processing portion 1506.

The filter state value output from signal processing portion 518 is ROM data in the sequence of 0-3-1-2-2-1-3-0, as shown in FIG. 16J. Here, the ROM data in accordance with "0" and "3" and ROM data in accordance with "1" and "2" are the same as in Table 2. The filter state value of signal processing portion 518 is stored temporarily by register 1528, and this stored value and the filter state value of output by signal processing portion 518 are summed by adder 522, thus the same result needs only to be output once, as shown in FIG. 14L. It is known that the filter state value according to this result is output in the same sequence as in FIG. 9M.

With regard to the third embodiment of the present invention, the same filtering effect as obtained using the FIR filter of FIG. 5 can be obtained. In this embodiment, the required ROM capacity is $2^{(L/2)-1}$ times m, which is reduced as compared with the capacity $2^L$ times m of ROM required in the conventional FIR filter and with the capacity $2^{L/2}$ times m of ROM required in the FIR filter of FIG. 5. In addition, the size of the whole hardware is reduced because only one signal processing portion for performing the ones complement, another signal processing portion for performing the twos complement, and one multiplexer are required.

As described above, when filter input data is applied, the present invention generates it as an address through two delay lines, and provides a filter state value stored in a ROM bank connected corresponding to the delay lines through the generated address. This sharply reduces the ROM capacity required in the FIR filter.

Using the fact that the ROM addresses are symmetric according to its areas, the present invention reduces the number of bits of the address for accessing the filter state value by one bit, further reducing the ROM capacity needed.

The present invention controls the clock period using the filter coefficient symmetry so that only one ROM bank is used to reduce the hardware size of the FIR filter as well as to reduce the ROM capacity required.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A finite impulse response filter, having a filter length L, for finite-impulse-response-filtering input data of a predetermined impulse form, said finite impulse response filter comprising:

first delay means for delaying said input data by L/2 steps according to a predetermined symbol rate;

second delay means for receiving a final delay output from said first delay means and delaying it by L/2 steps according to said symbol rate;

a first ROM bank having a plurality of ROMs for storing filter state values in accordance with a predetermined number of taps;

a second ROM bank having a plurality of ROMs for storing filter state values in accordance with said predetermined number of taps;

a first address generator for generating data in respective delay steps performed by said first delay means as a first address for addressing one of said filter state values stored in said ROMs of said first ROM bank;

a second address generator for generating data in respective delay steps performed by said second delay means as a second address for addressing one of said filter state values stored in said ROMs of said second ROM bank;

a first multiplexer for sequentially multiplexing the filter state values output from said ROMs of said first ROM bank according to a clock oversampling rate/2 times as large as the symbol rate;

a second multiplexer for sequentially multiplexing the filter state values output from said ROMs of said second ROM bank in the reverse sequence of said first multiplexer; and an adder for summing the outputs of said first and second multiplexers and outputting the result as filter output data.

2. The finite impulse response filter as claimed in claim 1, further comprised of a capacity of each of said first and second ROM banks being $2^{L/2}$.

3. The finite impulse response filter as claimed in claim 1, further comprised of said first address generator outputting, as is, the data of (L/2)−1 delay steps of said L/2 delay steps of said first delay means as said first address when an initial delay step of said first delay means outputs a data bit having a value of logic "0", and ones complementing the output data of said (L/2)−1 delay steps for output as said first address when said initial delay step of said first delay means outputs a data bit having a value of logic "1".

4. The filter as claimed in claim 1, further comprised of said second address generator outputting, as is, the data of (L/2)−1 delay steps of said L/2 delay steps of said second delay means as said second address when a final delay step of said second delay means outputs a data bit having a value of logic "0", and ones complementing the output data of said (L/2)−1 delay steps for output as said second address when said final delay step of said second delay means outputs a data bit having a value of logic "1".

5. A finite impulse response filter for finite-impulse-response-filtering input data of a predetermined impulse form, said finite impulse response filter comprising:

first delay means for delaying said input data by L/2 steps according to a predetermined symbol rate;

second delay means for receiving input data from the final delay step of said first delay means and delaying it by L/2 steps according to the symbol rate;

a first ROM bank having a plurality of ROMs for storing filter state values in accordance with a predetermined number of taps;

a second ROM bank having a plurality of ROMs for storing filter state values in accordance with said predetermined number of taps;

a first address generator for outputting, as is, the data of (L/2)−1 delay steps of said L/2 delay steps of said first delay means as a first address for addressing one of said filter state values stored in said ROMs of said first ROM bank when an initial delay step of said first delay means outputs a data bit having a value of logic "0", and ones complementing the output data of said (L/2)−1 delay steps for output as said first address when said initial delay step of said first delay means outputs a data bit having a value of logic "1" as said first address for addressing one of said filter state values stored in said ROMs of said first ROM bank;

a second address generator for outputting, as is, the data of (L/2)−1 delay steps of said L/2 delay steps of said second delay means as a second address for addressing one of said filter state values stored in said ROMs of said second ROM bank when a final delay step of said second delay means outputs a data bit having a value of logic "0", and ones complementing the output data of said (L/2)−1 delay steps of said second delay means for output as said second address when said final delay step of said second delay means outputs a data bit having a value of logic "1" as said second address for addressing one of said filter state values stored in said ROMs of said second ROM bank;

a first multiplexer for sequentially multiplexing the filter state values output from said ROMs of said first ROM bank according to a clock oversampling rate/2 times as large as the symbol rate;

a second multiplexer for sequentially multiplexing the filter state values output from said ROMs of said second ROM bank in the reverse sequence of said first multiplexer;

a first filter state value processing means for twos complementing the filter state value output from said first multiplexer when said initial delay step of said first delay means outputs said data bit having said value of logic "0", and outputting said filter state value output from said first multiplexer when said initial delay step of said first delay means outputs said data bit having said value of logic "1"; and a second filter state value processing means for twos complementing the filter state value output from said second multiplexer when said final delay step of said second delay means outputs said data bit having said value of logic "0", and outputting said filter state value output from said second multiplexer when said final delay step of said second delay means outputs said data bit having said value of logic "1".

6. The finite impulse response filter as claimed in claim 5, further comprised of a capacity of each of said first and second ROM banks being $2^{L/2}$.

7. The finite impulse response filter as claimed in claim 5, further comprised of said first address generator generating said first address utilizing the data of a delay step adjacent said initial delay step of said first delay means as its most significant bit, and utilizing the data of said final delay step of said first delay means as its least significant bit.

8. The finite impulse response filter as claimed in claim 7, said first address generator comprising a plurality of exclusive OR gates each having a first input terminal and a second input terminal, said first input terminal being supplied with said data of said initial delay step of said first delay means, said second terminal being supplied respectively with the data of the remaining (L/2)-1 delay steps.

9. The finite impulse response filter as claimed in claim 7, further comprised of said second address generator generating said second address utilizing the data of a delay step adjacent said final delay step of said second delay means as its most significant bit, and utilizing the data of an initial delay step of said second delay means as its least significant bit.

10. The finite impulse response filter as claimed in claim 9, said second address generator comprising a plurality of exclusive OR gates each having a first input terminal and a second input terminal, said first input terminal being supplied with said data of said final delay step of said second delay means, said second terminal being supplied respectively with the data of the remaining (L/2)-1 delay steps of said second delay means.

11. The finite impulse response filter as claimed in claim 5, further comprised of said second address generator generating said second address utilizing the data of a delay step adjacent said final delay step of said second delay means as its most significant bit, and utilizing the data of an initial delay step of said second delay means as its least significant bit.

12. The finite impulse response filter as claimed in claim 11, said second address generator comprising a plurality of exclusive OR gates each having a first input terminal and a second input terminal, said first input terminal being supplied with said data of said final delay step of said second delay means, said second terminal being supplied respectively with the data of the remaining (L/2)-1 delay steps of said second delay means.

13. A finite impulse response filter for finite-impulse-response-filtering input data of a predetermined impulse form, said finite impulse response filter comprising:

first delay means comprised of a first plurality of serially coupled delays, each of said delays delaying and outputting said input data according to a first clock rate;

second delay means comprised of a second plurality of serially coupled delays symmetric with the respective said first plurality of delays, each of said delays of said second delay means delaying and outputting the final delay output of said first delay means according to said first clock rate;

a counter for counting a second clock rate twice said first clock rate according to a predetermined oversampling rate, outputting a first counting result as a first output signal, and outputting a second output signal indicative of a reversal of said first counting result;

a first multiplexer for multiplexing and outputting the data output by the initial delay of said first delay means and the output of the final delay of said second delay means according to a third clock rate four times faster than said first clock rate;

a second multiplexer for multiplexing and outputting said first and second output signals according to said third clock rate;

a plurality of additional multiplexers for multiplexing the data output by the rest of the delays, excluding the initial delay, of said first delay means and the rest delays of said second delay means, excluding the final delay of said second delay means, which are symmetric to the rest of the delays of the first delay device, according to said third clock rate;

a plurality of exclusive OR gates each having a first input terminal and a second input terminal, said first input terminal being supplied with said data output by said first multiplexer, said second terminal being supplied respectively with the data output by said additional multiplexer;

a lookup table for storing filter state values in accordance with a predetermined number of taps, and outputting a filter state value accessed by an address utilizing the output of said second multiplexer and the outputs of said exclusive OR gates;

signal processing means for twos complementing the filter state value output from said lookup table when the output of said first multiplexer has a first logic value, and outputting, as is, said filter state value output from said lookup table when the output of said first multiplexer has a second logic value;

a register for temporarily storing the output of said signal processing means; and an adder for summing the filter state value temporarily stored by said register and the filter state value output by said signal processing means, and outputting the summed result as filter output data.

14. The finite impulse response filter as claimed in claim 13, further comprised of said lookup table having a capacity of $2^{(L/2)+1}$, wherein L is indicative of a length of said finite impulse response filter.

15. The finite impulse response filter as claimed in claim 13, further comprised of said lookup table outputting a filter state value accessed by an address which utilizes the output of said second multiplexer as a most significant bit and the outputs of said plurality of exclusive OR gates as the rest of the bits of said address.

16. The finite impulse response filter as claimed in claim 15, said plurality of exclusive OR gates being L/2 exclusive OR gates for outputting L/2 address bits.

17. The finite impulse response filter as claimed in claim 15, said signal processing means twos complementing said filter state value when said first logic value of said output of said first multiplexer is "1", and said signal processing means outputting, as is, said filter state value when said second logic value of said output of said first multiplexer is "0".

18. A finite impulse response filter, having a length L, for finite-impulse-response-filtering input data of a predetermined impulse form, said finite impulse response filter comprising:

first delay means having an L/2 plurality of serially coupled delay devices, each of said delay devices delaying and outputting said input data according to a predetermined symbol rate;

second delay means having a L/2 plurality of serially coupled delay devices symmetric with the respective to said delay devices of said first delay means, each of said delay devices of said second delay means delaying and outputting the final delay output of said first delay means according to said symbol rate;

a counter for counting a clock two times as large as said symbol rate according to a predetermined oversampling rate, outputting a counting result as a first output signal, and outputting a second output signal indicative of a reverse of said counting result;

a first multiplexer for multiplexing and outputting said first and second output signals according to a clock four times as large as said symbol rate;

a second multiplexer for multiplexing and outputting the data output by the initial delay device of said first delay means and the data output by the final delay device of said second delay means according to said clock four times as large as said symbol rate;

a plurality of additional multiplexers for multiplexing the data output by the rest of the delay devices, excluding the initial delay device, of said first delay means and the data output by the rest of the delay devices, excluding the final delay device of said second delay means, of said second delay means which are symmetric with the rest of the delay devices of the first delay means, according to said clock four times as large as said symbol rate;

a plurality of exclusive OR gates having a first input terminal and a second input terminal, said first input teal of each of said additional multiplexers being supplied with the data output by said second multiplexer, and said second input terminal being supplied, respectively, with the data output by said plurality of additional multiplexers;

a ROM bank comprised of a plurality of ROMs for storing filter state values in accordance with a predetermined number of taps, and outputting the filter state values of the respective ROMs accessed by an address comprised of the outputs of said plurality of exclusive OR gates;

means for multiplexing and outputting said filter state values output from said respective ROMs of said ROM bank in response to the output of said first multiplexer;

signal processing means for outputting the filter state value output from said means for multiplexing, as is, when said output of said second multiplexer has a first logic value, and for twos complementing said filter state value when said ouput of said second multiplexer has a second logic value;

a register for temporarily storing the output of said signal processing means; and an adder for summing the filter state value temporarily stored by said register and the filter state value processed by said signal processing means, and outputting the result as filter output data.

19. The finite impulse response filter as claimed in claim 18, further comprised of said ROM bank having the capacity of $2^{(L/2)-1}$.

20. The finite impulse response filter as claimed in claim 18, said plurality of exclusive OR gates being (L/2)−1 exclusive OR gates for outputting (L/2)−1 address bits for accessing the filter state values stored in said ROMs of said ROM bank.

21. The finite impulse response filter as claimed in claim 18, said signal processing means twos complementing said filter state value when said second logic value is "1", and said signal processing means outputting, as is, said filter state value when said first logic value is "0".

22. A filtering method for a finite impulse response filter having a filter length L and comprised of at least first and second ROM banks for storing filter state values in accordance with a predetermined number of taps, said method comprising the steps of:

delaying input data of a predetermined impulse form using first and second delay lines;

generating first and second addresses from the data delayed by said first and second delay lines, respectively;

outputting a filter state value stored in said first ROM bank in response to said first address;

outputting a filter state value stored in said second ROM bank in response to said second address;

multiplexing as first output filter data, said filter state values output by said first ROM bank in response to a first clock having an oversampling rate/2 times as large as said symbol rate;

multiplexing as second output filter data, said filter state values output by said second ROM bank in response to second clock having a reverse sequence of said first clock;

generating filter output data by adding the first output filter data and the second output filter data.

23. The method as claimed in claim 22, said delaying step comprising:

delaying said input data through a first series of L/2 delay steps; and delaying the data output by the last delay step of said first series of L/2 delay steps by a second series of L/2 delay steps.

24. A filtering method for a finite impulse response filter having a filter length L and comprising at least first and second ROM banks formed by a plurality of ROMs for storing filter state values in accordance with a predetermined number of taps, a first delay portion for delaying input data of a predetermined impulse form by L/2 delay steps according to a predetermined symbol rate, and a second delay portion for delaying the data finally delayed and output by said first delay portion by L/2 steps, said method comprising the steps of:

generating first addresses by selectively performing a ones complement operation on data output by (L/2)−1 of said L/2 delay steps of said first delay portion or outputting said data output by said (L/2)–1 delay steps as is, in response to a value of data output by an initial delay step of said first delay portion;

generating second addresses by selectively performing a ones complement operation on data output by (L/2)–1 of said L/2 delay steps of said second delay portion or outputting said data output by said (L/2)–1 delay steps of said second delay portion as is, in response to a value of data output by a final delay step of said second delay portion;

outputting filter state values stored in said ROMs of said first ROM bank in response to said first addresses;

outputting filter state values stored in said ROMs of said second ROM bank in response to said second addresses;

multiplexing, for output, said filter state values output by said ROMS of said first ROM bank in response to a first clock having an oversampling rate/2 times as large as said symbol rate;

multiplexing, for output, said filter state values output by said ROMS of said second ROM bank in response to second clock having a reverse sequence of said first clock;

selectively performing a twos complement operation on said filter state values output by said ROMs of said first ROM bank or directly outputting said filter state values output from said ROMs of said first ROM bank, in response to said value of data output by said initial delay step of said first delay portion;

selectively performing a twos complement operation on said filter state values output by said ROMs of said second ROM bank or directly outputting said filter state values output from said ROMs of said second ROM bank, in response to said value of said data output by said final delay step of said second delay portion; and outputting filter output data by summing the filter state values output during said step of selectively performing twos complement on said filter state values output by said ROMs of said first ROM bank or directly outputting said filter state values output from said ROMs of said first ROM bank and said step of selectively performing twos complement on said filter state values output by said ROMs of said second ROM bank or directly outputting said filter state values output from said ROMs of said second ROM bank.

25. The method as claimed in claim 24, wherein the respective ROMs of said first and second ROM banks have capacity of $2^{L/2-1}$, said method further comprising the steps of:

counting a clock signal having a clock rate two times as large as said symbol rate in a first counting direction to produce said first clock; and counting said clock signal having said clock rate two times as large as said symbol rate in a second counting direction to produce said second clock.

26. The method as claimed in claim 24, further comprising the steps of:

performing said step of generating first addresses by performing said ones complement operation on said data output by said (L/2)–1 of said L/2 delay steps of said first delay portion when said initial delay step of said first delay portion has a value of logic "1"; and performing said step of outputting said data output by said (L/2)–1 of said L/2 delay steps of said first delay portion when said initial delay step of said first delay portion has a value of logic "0".

27. The method as claimed in claim 24, further comprising the steps of:

performing said step of generating second addresses by performing a ones complement operation on said data output by said (L/2)–1 of said L/2 delay steps of said second delay portion when said final delay step of said second delay portion has a value of logic "1"; and performing said step of outputting said data output by said (L/2)–1 delay steps of said second delay portion as is when said final delay step of said second delay portion has a value of logic "0".

28. The method as claimed in claim 24, further comprising the steps of:

performing said twos complement operation on said filter state values output by said ROMs of said first ROM bank when said initial delay step of said first delay portion has a value of logic "1"; and directly outputting said filter state values output from said ROMs of said first ROM bank when said initial delay step of said first delay portion has a value of logic "0".

29. The method as claimed in claim 24, further comprising the steps of:

performing said twos complement operation on said filter state values output by said ROMs of said second ROM bank when said final delay step of said second delay portion has a value of logic "1"; and directly outputting said filter state values output from said ROMs of said second ROM bank when said final delay step of said second delay portion has a value of logic "0".

30. A filtering method for a finite impulse response filter having a filter length L and comprising at least a lookup table for storing filter state values in accordance with a predetermined number of taps, a first delay means having L/2 delay devices and for delaying input data of a predetermined impulse form by L/2 steps according to a predetermined symbol rate, and a second delay means having L/2 delay devices symmetrically corresponding to the respective delay devices of said first delay means for delaying the data output by the final delay device of said first delay means by L/2 steps, said method comprising the steps of:

applying, respectively, data output by each of said L/2 delay devices of said first delay means to a first input terminal of respective L/2 multiplexers;

applying, respectively, data output by each of said L/2 delay devices of said second delay means to a second input terminal of said L/2 multiplexers;

generating a control signal by multiplexing data output by an initial delay step of said first delay means and data output by a final delay step of said second delay means by a first one of said L/2 multiplexers in response to a first clock having a rate four times as large as said symbol rate;

generating (L/2)–1 address bits by multiplexing, in response to said first clock signal, data output by the remaining (L/2)–1 delay steps of said L/2 delay steps of said first and second delay means, the final delay step of said first delay means and the initial delay step of said second delay means being multiplexed by one of the remaining (L/2)–1 multiplexers to produce a least significant bit of said (L/2)–1 address bits;

generating a first output signal and a second output signal by counting a second clock having a rate two times as large as said symbol rate according to a predetermined oversampling rate in a first counting direction and in a second counting direction the reverse of said first counting direction, respectively;

generating an address bit pair, said address bit pair being used in combination with said (L/2)–1 address bits as a most significant bit and next most significant bit of an address for addressing said lookup table, by applying said first and second output signals to an additional multiplexer in response to said first clock;

applying said control signal to a first input terminal of (L/2)–1 exclusive-OR gates;

applying said (L/2)–1 address bits to respective ones of second input terminals of said (L/2)–1 exclusive OR gates;

outputting filter state values from said lookup table in response to said address bit pair and outputs of said (L/2)–1 exclusive OR gates;

selectively performing a twos complement operation on said filter state values output by said lookup table or directly outputting said filter state values output from said lookup table, in response to a value of said control signal;

temporarily storing the filter state values output from said step of performing a twos complement operation on said filter state values output by said lookup table or the filter state values output from said step of directly outputting said filter state values output from said lookup table; and generating filter output data by summing the temporarily stored filter state values and the filter state values output from said step of performing a twos complement operation on said filter state values output by said lookup table or the filter state values output from said step of directly outputting said filter state values output from said lookup table.

31. The method as claimed in claim 30, wherein said lookup table has the capacity of $2^{L/2+1}$.

32. The method as claimed in claim 30, further comprising the steps of:

performing said twos complement operation on said filter state values output by said lookup table when said control signal has a value of logic "1"; and directly outputting said filter state values output from said lookup table when said control signal has a value of logic "0".

33. A filtering method for a finite impulse response filter having a filter length L and comprising at least a ROM bank made up with a plurality of ROMs and for storing filter state values in accordance with a predetermined number of taps, a first delay means having L/2 delay devices and for delaying input data of a predetermined impulse form by L/2 steps according to a predetermined symbol rate, and a second delay means having L/2 delay devices for delaying the data output by the final delay device of said first delay means by L/2 steps, said method comprising the steps of:

counting a first clock having a rate two times as large as said symbol rate according to a predetermined oversampling rate, and outputting a first output signal indicative of a counting result obtained by counting in a first counting direction, and a second output signal indicative of reverse sequence of said counting result;

multiplexing, for output, said first and second output signals in response to a second clock having a rate four times as large as said symbol rate;

generating a control signal by multiplexing an output value of an initial delay step performed by said first delay means and an output value of a final delay step performed by said second delay means in response to said second clock;

generating (L/2)–1 address bits by multiplexing output values, excluding the output value of said initial delay step of said first delay means, of said first delay means with output values, excluding the final delay step of said second delay means, of said second delay means, in response to said second clock;

applying said control signal to a first input terminal of (L/2)–1 exclusive-OR gates;

applying respective ones of said (L/2)–1 address bits to a second input terminal of respective ones of said (L/2)–1 exclusive-OR gates;

addressing filter state values stored in said ROMs of said ROM bank in response to output values generated by said (L/2)–1 exclusive-OR gates;

multiplexing the filter state values output from said ROMs of said ROM bank, in response to an output obtained by said step of multiplexing said first and second output signals;

selectively performing a twos complement operation on said filter state values output by said step of multiplexing the filter state values output from said ROMs of said ROM bank or directly outputting said filter state values output by said step of multiplexing the filter state values output from said ROMs of said ROM bank, in response to a value of said control signal;

temporarily storing the filter state values output from said step of performing a twos complement operation or the filter state values output from said step of directly outputting said filter state values; and generating filter output data by summing the temporarily stored filter state values and the filter state values output from said step of performing a twos complement operation or the filter state values output from said step of directly outputting said filter state values.

34. The method as claimed in claim 33, wherein said ROM bank has the capacity of $2^{L/2-1}$.

35. The method as claimed in claim 33, further comprising the steps of:

performing said twos complement operation when said control signal has a value of logic "1"; and directly outputting said filter state values when said control signal has a value of logic "0".

* * * * *